US005382282A

United States Patent [19]
Pennaz

[11] Patent Number: 5,382,282
[45] Date of Patent: Jan. 17, 1995

[54] INK COMPOSITION AND METHOD OF MAKING, USING AND RECOVERING SUCH COMPOSITION

[75] Inventor: Thomas J. Pennaz, Brooklyn Park, Minn.

[73] Assignee: Deluxe Corporation, St. Paul, Minn.

[21] Appl. No.: 120,175

[22] Filed: Sep. 13, 1993

Related U.S. Application Data

[63] Continuation-in-part of Ser. No. 92,392, Jul. 14, 1993, Pat. No. 5,338,351, which is a continuation-in-part of Ser. No. 946,762, Sep. 17, 1992, abandoned.

[51] Int. Cl.⁶ .............................................. C09D 11/00
[52] U.S. Cl. ................................... 106/20 R; 106/30 R; 106/27 R; 106/29 R; 106/218; 106/219
[58] Field of Search .................. 106/20 R, 30 R, 27 R, 106/29 R, 218, 219

[56] References Cited

U.S. PATENT DOCUMENTS

| | | | |
|---|---|---|---|
| 437,780 | 10/1890 | Higgins | 106/27 R |
| 1,070,713 | 8/1913 | Meckbach | 106/27 R |
| 1,822,533 | 9/1931 | Lasher | 106/31 R |
| 2,139,092 | 12/1938 | Neidich | 106/27 R |
| 2,346,968 | 4/1944 | Jeuck et al. | 106/30 R |
| 2,350,523 | 6/1944 | O'Neal | 106/27 R |
| 2,365,363 | 12/1944 | Swain | 106/27 R |
| 2,427,921 | 9/1947 | Pfaelzer | 106/27 R |
| 2,621,130 | 12/1952 | Cutler | 106/30 A |
| 2,720,461 | 10/1955 | Voet | 106/30 B |
| 3,289,577 | 12/1966 | Uhlig | 106/2 |
| 3,383,391 | 5/1968 | Carlick et al. | 106/27 R |
| 3,404,014 | 10/1968 | Drautz | 106/30 R |
| 3,434,987 | 3/1969 | Dhein et al. | 106/252 |
| 3,471,415 | 10/1969 | Friedman et al. | 524/145 |
| 3,533,811 | 10/1970 | Clements et al. | 106/24 B |
| 3,597,376 | 8/1971 | Tashiro | 106/27 R |
| 3,652,469 | 3/1972 | Glaser et al. | 106/27 R |
| 3,660,329 | 5/1972 | Wysacki | 106/30 R |
| 3,776,865 | 12/1973 | Glaser et al. | 106/27 R |
| 3,804,640 | 4/1974 | Buckwalter | 106/27 A |
| 3,844,994 | 10/1974 | Vijayendran | 106/20 R |
| 3,847,850 | 11/1974 | Rudolphy | 106/27 R |
| 3,850,648 | 11/1974 | Biedel et al. | 106/27 R |
| 3,890,156 | 6/1975 | Hiroharo et al. | 106/27 R |
| 3,900,436 | 8/1975 | Drawert et al. | 106/27 R |
| 3,914,195 | 10/1975 | Asai et al. | 106/27 R |
| 3,946,138 | 3/1976 | Jones | 106/27 R |
| 3,953,218 | 4/1976 | Pollard | 106/27 R |
| 3,981,730 | 9/1976 | Takahashi et al. | 106/27 R |
| 4,026,794 | 5/1977 | Mauceri | 210/708 |
| 4,069,179 | 1/1978 | Jones | 106/27 R |
| 4,072,644 | 2/1978 | Hedrick | 524/528 |
| 4,077,807 | 3/1978 | Kramer et al. | 106/30 R |
| 4,137,083 | 1/1979 | Hedrick | 106/20 R |
| 4,155,886 | 5/1979 | DeGoler | 106/19 R |
| 4,163,001 | 7/1979 | Carumpalos et al. | 106/20 R |
| 4,183,833 | 1/1980 | Miyaguchi et al. | 106/27 R |
| 4,221,686 | 9/1980 | Sakiyama et al. | 106/27 R |
| 4,229,747 | 10/1980 | Hwang | 106/22 R |
| 4,256,619 | 3/1981 | Miyaguchi et al. | 524/571 |
| 4,330,450 | 5/1982 | Lipowski | 524/547 |
| 4,361,843 | 11/1982 | Cooke et al. | 106/27 R |
| 4,363,886 | 12/1982 | Lipowski et al. | 523/336 |
| 4,385,149 | 5/1983 | Tsuchiya et al. | 106/20 R |
| 4,386,961 | 6/1983 | Lin | 106/27 R |
| 4,388,434 | 6/1983 | Swift et al. | 524/476 |
| 4,392,917 | 7/1983 | Lipowski et al. | 162/168.1 |
| 4,400,215 | 8/1983 | Cooke et al. | 106/27 R |
| 4,419,132 | 12/1983 | Moynihan | 106/27 R |
| 4,484,948 | 11/1984 | Merritt et al. | 106/30 R |

(List continued on next page.)

OTHER PUBLICATIONS

The Printing Ink Manual, Fourth Edition (1988) edited by R. H. Leach and published by VanNostrand Reinhold (no month).

*Primary Examiner*—Helene Klemanski
*Attorney, Agent, or Firm*—Dorsey & Whitney

[57] ABSTRACT

An ink composition incorporating a water reducible resin which is water insoluble under certain conditions and selectively water washable under certain other conditions. The method aspect of the present invention relates to a method of making, using and recovering the ink composition.

18 Claims, No Drawings

U.S. PATENT DOCUMENTS

| | | | |
|---|---|---|---|
| 4,505,828 | 3/1985 | Lipowski et al. | 252/8.554 |
| 4,508,868 | 4/1985 | Whyzmuzis et al. | 106/27 R |
| 4,514,540 | 4/1985 | Peck | 106/20 R |
| 4,519,841 | 5/1985 | Moynihan | 106/27 R |
| 4,528,036 | 7/1985 | Rudolphy | 106/30 C |
| 4,531,976 | 7/1985 | Lin | 106/27 R |
| 4,552,592 | 11/1985 | Rudolphy et al. | 106/30 C |
| 4,552,670 | 11/1985 | Lipowski | 507/120 |
| 4,554,019 | 11/1985 | Moynihan | 106/27 R |
| 4,556,427 | 12/1985 | Lewis | 106/20 R |
| 4,579,888 | 4/1986 | Kodama et al. | 106/20 R |
| 4,589,920 | 5/1986 | Kanada et al. | 106/30 R |
| 4,595,518 | 6/1986 | Raynolds et al. | 252/8.6 |
| 4,612,051 | 9/1986 | Miller et al. | 106/30 R |
| 4,648,905 | 3/1987 | Peck et al. | 106/29 R |
| 4,659,380 | 4/1987 | Winters et al. | 106/14.14 |
| 4,664,710 | 5/1987 | Gleason et al. | 106/23 D |
| 4,664,711 | 5/1987 | Kawaguchi et al. | 106/30 R |
| 4,699,660 | 10/1987 | Frank et al. | 106/20 R |
| 4,732,616 | 3/1988 | Kondo et al. | 106/20 R |
| 4,747,882 | 5/1988 | Schwartz et al. | 106/23 R |
| 4,758,276 | 7/1988 | Lin et al. | 106/27 R |
| 4,760,104 | 7/1988 | Miyaguma et al. | 106/27 R |
| 4,764,215 | 8/1988 | Rudolph | 106/27 R |
| 4,765,243 | 8/1988 | Schiefer et al. | 106/20 R |
| 4,783,220 | 11/1988 | Gamble et al. | 106/27 R |
| 4,789,399 | 12/1988 | Williams et al. | 106/20 R |
| 4,810,747 | 3/1989 | Bornack et al. | 524/538 |
| 4,822,419 | 4/1989 | Pepoy et al. | 106/20 R |
| 4,853,421 | 8/1989 | Hayes | 523/223 |
| 4,870,139 | 9/1989 | Kveglis et al. | 524/420.5 |
| 4,886,553 | 12/1989 | Gillich | 101/451 |
| 4,886,844 | 12/1989 | Hayes | 523/223 |
| 4,891,070 | 1/1990 | Dilling et al. | 106/26 R |
| 4,904,303 | 2/1990 | Rudolphy et al. | 106/30 R |
| 4,938,801 | 7/1990 | Yoshioka et al. | 106/20 R |
| 4,942,111 | 7/1990 | Wade et al. | 430/273 |
| 4,943,430 | 7/1990 | Hefford et al. | 427/70 |
| 4,944,768 | 7/1990 | Balliello et al. | 8/524 |
| 4,960,464 | 10/1990 | Chen | 106/27 R |
| 4,963,188 | 10/1990 | Parker | 106/20 R |
| 4,966,628 | 10/1990 | Amon et al. | 106/20 R |
| 4,982,661 | 1/1991 | Zweig | 101/451 |
| 4,990,185 | 2/1991 | Krishnan | 106/20 R |
| 5,004,763 | 4/1991 | Imogawa | 523/161 |
| 5,009,716 | 4/1991 | Gerson | 134/40 |
| 5,015,711 | 5/1991 | Simonet et al. | 526/301 |
| 5,017,228 | 5/1991 | Goda | 106/20 R |
| 5,021,538 | 6/1991 | Crews | 528/129 |
| 5,026,755 | 6/1991 | Kveglis et al. | 106/20 R |
| 5,030,683 | 7/1991 | Nakamura | 524/512 |
| 5,041,161 | 8/1991 | Cooke et al. | 106/27 R |
| 5,066,331 | 11/1991 | Hutter | 106/20 R |
| 5,074,915 | 12/1991 | Yoshioka et al. | 106/30 R |
| 5,077,348 | 12/1991 | Nakamura et al. | 524/512 |
| 5,084,333 | 1/1992 | Beach et al. | 428/272 |
| 5,087,659 | 2/1992 | Fujisawa | 524/594 |
| 5,098,478 | 3/1992 | Krishnan et al. | 106/20 R |
| 5,100,718 | 3/1992 | Weintraub | 428/195 |
| 5,100,934 | 3/1992 | Glesias | 106/20 R |
| 5,101,010 | 3/1992 | Dickens et al. | 106/20 R |
| 5,102,856 | 4/1992 | Doll et al. | 503/209 |
| 5,104,449 | 4/1992 | Pavlin | 106/30 R |
| 5,104,567 | 4/1992 | Staehr | 252/174.17 |
| 5,106,416 | 4/1992 | Moffatt et al. | 106/30 R |
| 5,109,054 | 4/1992 | Smith | 524/514 |
| 5,114,478 | 5/1992 | Auslander et al. | 106/30 R |
| 5,116,409 | 5/1992 | Moffatt | 106/20 R |
| 5,118,583 | 6/1992 | Kondo et al. | 101/451 |
| 5,127,948 | 7/1992 | Shepherd | 106/30 R |
| 5,234,577 | 8/1993 | Van Slyke | 134/27 |

INK COMPOSITION AND METHOD OF MAKING, USING AND RECOVERING SUCH COMPOSITION

This is a continuation-in-part of application Ser. No. 08/092,392 filed Jul. 14, 1993 now U.S. Pat. No. 5,338,351 which is a continuation-in-part of application Ser. No. 07/946,762 filed Sep. 17, 1992, now abandoned.

BACKGROUND OF THE INVENTION

1. Field of the Invention

The present invention relates generally to the field of ink compositions with special applicability to the field of lithographic compositions or oil based compositions usable in lithography and to the field of nonlithographic compositions in which the relationship of such compositions with aqueous solutions, including its solubility, can be selectively controlled. The compositions of the present invention are unaffected by water, and thus generally water insoluble, at certain selected acidic pH levels and water washable at certain other selected alkaline pH levels. The present invention also relates to methods of making, using and recovering such compositions.

2. Summary of the Prior Art

A wide variety of printing processes currently exist in the art. Although the ink composition and method of the present invention will have applicability to most if not all of these prior processes, it has particular applicability to a lithographic printing process commonly referred to as lithography. Lithography is a method of printing which relies on differences in solubility and surface wetability between an oil based component and an aqueous or aqueous based component to effectively transfer the printing ink to the desired image area and prevent it from transferring to the nonimage areas.

The printing apparatus commonly used in a lithographic process includes a printing plate which is treated to provide an oleophilic ink-accepting image area and an oleophobic ink-repelling nonimage area. Generally, the oleophilic or oil attracting image areas are hydrophobic or water repelling, and the oleophobic or oil repelling nonimage areas are hydrophilic or water attracting.

During a conventional lithographic printing process, an oil based or water insoluble ink composition and an aqueous fountain solution are applied to the printing plate. Because of the solubility and the wetability differences of the oil based and aqueous compositions, the fountain solution is preferentially attracted to and preferentially wets the oleophobic nonimage areas, while the ink is preferentially attracted to and preferentially wets the oleophilic image areas. It is well known and accepted in the art that successful lithographic printing requires inks which exhibit stability relative to water and thus remain water insoluble. Absence of this characteristic will result in poor print quality, poor edge definition, dot gain and various other print deficiencies. Thus, lithographic inks are selected and formulated for their ability to remain stable, cohesive and insoluble when contacted with water. The simultaneous feeding of the ink composition and fountain solution to the print plate is accomplished through a variety of methods and roller configurations known in the art.

After the ink composition and fountain solution have been applied to the printing plate and allowed to gravitate to their respective oleophilic and oleophobic areas, they are transferred either directly to an image receiving paper or other print substrate or to an intermediate blanket cylinder which then subsequently transfers the ink to the paper. The former is known in the industry as direct plate to paper lithographic printing, while the latter is generally referred to as offset lithography. In offset lithography, the blanket cylinder is covered with a transfer substrate typically made of rubber which receives the ink from the printing plate and transfers it to the print substrate.

In the typical lithographic printing system described above, the ink pigment is carried by the oil based component while the fountain solution comprises the aqueous component. Although there has been little commercial application to date, the opposite could also be used. In other words, the image areas could be oleophobic (or hydrophilic) with the ink pigment being carried by the aqueous component and the nonimage areas could be oleophilic (or hydrophobic) with the fountain solution being oil based. In either system, the lithographic process, by definition, must include both an oil based or water insoluble component and an aqueous component. Certain aspects of the present invention are applicable to either system. Thus, the present invention relates broadly to an improved oil based or water insoluble component or composition for use in a lithographic or other printing process.

During the course of lithographic printing, the printing plates are periodically changed as one job is completed and another started. Whenever this occurs, the blanket cylinder in an offset process must be cleaned to remove ink residue which is present from the previous job. Further, if a change of ink is desired, the entire print train including the application rollers, the print plate and the blanket must be cleaned. Such cleaning is commonly accomplished using an appropriately formulated wash solvent. To be effective as a wash solvent, the wash must be compatible with, or be able to dissolve or sufficiently disperse the ink. Since the inks are oil based or water insoluble, this necessitates the use of organic or petroleum based or other non-aqueous wash solvents to effectively remove the ink from the rollers, printing plates, blanket cylinder, etc.

These organic wash solvents can give rise to employee safety concerns and are a large source of both air and water pollution as volatile organic compounds (VOC's) are dispersed into the atmosphere or disposal systems. Such pollution is due to evaporation into the ambient air or into a venting system during the washing of the print components as well as the disposal or laundering of shop towels and rags used in the cleaning process. Attempts to develop water based wash or cleaning solutions have not been successful due to the inherent ability of the ink to resist water. Attempts have also been made to use water/solvent mixtures by emulsifying petroleum-based solvents into water through the use of emulsifiers and surfactants, but these products suffer from inherent instability due to immiscibility of water and the solvents and perform slowly. Further, such mixtures do not completely eliminate the use of petroleum solvents which are still commonly present in an amount of about 30-80%. Other industry trends include the use of solvents such as terpenes. While not petroleum based, their performance has been marginal and they are costly and in short supply. In addition, their use and disposal also pose environmental concerns.

Thus, although offset lithography is recognized and established as a dominant printing process for certain applications, drawbacks exist because of the pollution problems referred to above. These are becoming more of a drawback and more of a problem as new pollution control regulations and standards are mandated. In fact, because of the very nature of the lithographic process at least one of the components (either the ink composition or the fountain solution) must be oil based or water insoluble. This in turn necessitates the use of an organic or petroleum based solvent to wash the apparatus. This is generally accepted as a necessary limitation of the lithographic process about which little can be done.

For nonlithographic applications, various water based or water soluble inks are currently available. Some of these utilize water dispersible or soluble resins which have been preneutralized to provide such properties. See for example U.S. Pat. No. 4,966,628 issued on Oct. 20, 1990 to Amos et al. While these inks can be cleaned up with water or water solutions and thus reduce pollution concerns, it is generally recognized that existing water soluble or dispersible inks exhibit inferior water and alkaline resistance as well as inferior drying, adhesion and gloss properties when compared to conventional oil based inks.

Radiation curable inks have been used, both lithographically and nonlithographically, to reduce the release of VOC's common to many oil based inks. However, despite the recognized advantages of radiation curable inks over ink compositions which set and/or dry by solvent evaporation, certain limitations continue to exist. For example, although radiation curable inks can be formulated with little if any solvent component, the components of conventional radiation curable ink compositions are not water soluble to the extent that they can be washed or cleaned up with aqueous solutions. Thus, the cleanup of radiation curable inks from printing plates, rollers, brushes, blankets and other application equipment necessarily involves the use of nonaqueous, organic or other solvents which are capable of dissolving or washing, and thus cleaning up, the various resins and other components of the ink composition. In many cases, these solvents are volatile organic compounds such as glycol ethers or esters. Some of these are considered as hazardous wastes, thereby creating obvious safety concerns and disposal problems. Others, even though not technically considered as hazardous wastes, still pose serious health and safety concerns. Various attempts have been made to overcome this problem by formulating water soluble radiation curable inks which are substantially water soluble and can thus be cleaned up with aqueous solutions. However, such water based or water soluble inks generally exhibit properties inferior to certain desired properties of water insoluble inks and do not print lithographically.

Accordingly, there is a need in the art to address the above problems and to provide an ink composition, and related methods of making, using and recovering, which substantially reduces if not eliminates the above pollution concerns. There is also a need in the art for ink compositions which, in addition to addressing pollution concerns, results in highly acceptable print quality and provides improved ink properties relating to ink set, ink life and the reduction of volatile solvents.

SUMMARY OF THE INVENTION

In contrast to the prior art, the present invention relates generally to an oil based or water insoluble ink composition, or to an oil based composition usable in a lithographic process, in which such compositions are substantially water insoluble and can be printed in their water insoluble form, but can be washed and cleaned up with an aqueous or aqueous based wash solution. Certain aspects of the present invention also relate to ink compositions having improved ink life properties without adversely affecting ink set and to ink compositions with reduced volatile solvents. Such compositions significantly reduce, if not eliminate, pollution and safety concerns while still maintaining highly acceptable print quality. In a nonlithographic application, the present invention relates to an oil based or substantially water insoluble ink which can be cleaned up with water and optionally exhibit improved set and life properties and reduced solvent content as well. The invention also relates to a method for making such a composition, a method of using the composition in a lithographic or other printing process and a method of recovering the composition residue after it has been washed or otherwise removed from the print apparatus.

A preferred embodiment of the present invention is based upon an improved oil based or water insoluble ink composition in which the solubility or washability of the composition relative to an aqueous or aqueous based solution can be selectively controlled, while at the same time exhibiting acceptable print quality and acceptable stability during printing. More specifically, the improved ink composition of the present invention is formulated so that its solubility or washability relative to an aqueous solution can be selectively controlled by varying the pH level of such solution. For a lithographic application, this facilitates the use of an aqueous fountain solution with a first pH level during the printing process in which the ink composition is stable and insoluble and can therefore print lithographically, and the use of an aqueous wash solution with a second, generally alkaline pH level during clean up in which the ink composition is soluble or washable. Such an ink composition eliminates the need for organic or petroleum based or other nonaqueous cleaning or washing solvents which in turn minimizes or eliminates pollution and employee safety concerns, while still achieving acceptable print quality. For nonlithographic applications, the ink can be printed in its water insoluble form to obtain the beneficial properties of a water insoluble ink, yet be cleaned up with an aqueous based solution.

More simply stated, the preferred ink composition of the present invention is substantially water insoluble during printing, but is capable of becoming selectively soluble or washable in an alkaline solution when cleanup is desired. Preferably, the composition includes a compatible, water reducible component which functions to provide the composition with the desired solubility characteristics. A further preferable feature of the system is that the change from being water insoluble to being water soluble or washable occur quickly, under ambient conditions, and utilize wash solutions which are safe and cost effective. The ink composition should also preferably employ existing ink components to utilize existing print equipment, substrates and plates. The ink composition of the present invention should also provide acceptable print quality.

In addition to the selective aqueous solubility of the ink composition of the present invention and its ability to be cleaned up using aqueous based solutions, further optional benefits may be derived from ink compositions formulated with water reducible resins. One benefit is the ability to formulate heat set and other inks with dramatically reduced volatile solvents and to formulate sheet fed and cold set inks with substantial elimination of all volatile petroleum based solvents. By formulating ink compositions comprised of a water reducible resin and various hard resins, preferably with higher acid values, comparable resin solubility and viscosity properties can be achieved with reduced volatile solvent. Another benefit is the ability to achieve improved life of the ink without adversely affecting the ink set. The "set" of an ink reflects the time needed for a printed ink to set up via evaporation, reaction, absorption or the like to a point where it can be handled without smearing of the ink. The "life" of an ink reflects the time an ink can remain on a print plate or other application equipment without setting. By formulating an ink composition with an unneutralized water reducible resin in combination with oleic acid or various other fatty acids, ink life can be dramatically increased without an adverse effect on, and in some cases with an improvement of, ink set.

Although the preferred embodiment contemplates an ink composition which is incorporated into the oil based or water insoluble component of a lithographic ink and a fountain solution which is aqueous based, these could be reversed. In such a case, the water solubility or washability of the oil based or water insoluble fountain solution would be changed when clean up is desired. It is also contemplated that the oil based ink composition of the present invention may have usefulness in print processes other than lithography, such as letter-press, gravure, flexographic, intaglio and the like, where use of an oil based or water insoluble ink which can be cleaned up with an aqueous solution is needed or desired, or where reduced petroleum solvent content or improved ink life is desired. The concept of the present invention is also applicable both to an oleoresinous system as well as to radiation curable inks which cure by exposure to UV or EB radiation.

The method aspect of the present invention relates to the making, using and recovery of an ink composition or oil based component of the type contemplated by the present invention or employing the general features of such composition or component. Specifically, the method of making the ink composition or component includes the steps of combining the various composition ingredients including a resin component or ingredient having selective aqueous solubility. The preferred method of making the ink composition or component involves formulating a resin component in which a portion, and in particular a solubility controlling portion, exhibits selective water solubility dependent on the pH of the solution with which it is contacted. The preferred solubility controlling portion is a water reducible resin such as a water reducible alkyd, polyester or the like.

The preferred process of using the ink composition or component includes applying the substantially water insoluble ink composition to a printing plate or other print application equipment, transferring such ink composition to a desired print receiving substrate or medium and then cleaning up or washing the application equipment with an aqueous alkaline solution. For lithographic printing, the process comprises the steps of applying the ink composition and a first aqueous solution comprising an aqueous fountain solution to a printing plate, transferring the ink composition to a receiving substrate or medium and then washing the printing plate, blanket and other print components with a second aqueous solution comprising an aqueous wash. In the preferred method, the first and second aqueous solutions have acidic and alkaline pH levels, respectively, the first in which the ink composition is substantially insoluble and the second in which the ink composition is soluble, washable or dispersible.

Finally, the preferred method of recovering the ink composition or other oil based component residue from a printing apparatus and wash solution includes the steps of washing or removing the composition ink residue from a portion of the apparatus using an aqueous wash solution with an alkaline pH level in which the ink composition is soluble or washable. This results in formation of a mixture comprised of ink residue and wash solution as well as soiled cleaning towels containing such mixture. The pH of such mixture is then changed to a level at which the ink composition is substantially water insoluble. This results in the ink composition precipitating into a removable form. The ink residue is then removed and recovered from such mixture by filtration, centrifugation or other techniques known in the art. The above process facilitates cleaning of the soiled towels and recovery of the wash solution and ink residue. This in turn facilitates recycling or more ready disposal of the wash solution and controlled disposal of the residue.

Accordingly, it is an object of the present invention to provide an oil based or water insoluble ink composition in which its solubility or washability relative to an aqueous medium can be controlled by selectively adjusting the pH of such aqueous medium.

Another object of the present invention is to provide an ink composition exhibiting improved ink life without adversely affecting the set of the ink.

Another object of the present invention is to provide an ink composition in which volatile solvents have been eliminated or dramatically reduced.

Another object of the present invention is to provide a radiation curable ink composition which can be printed in a substantially water insoluble form, but which can be cleaned up with an aqueous based solution.

Another object of the present invention is to provide an improved oil based or water insoluble lithographic composition for use as, or together with, a lithographic ink composition which can be washed with an alkaline aqueous wash solution and which provides acceptable print quality.

Another object of the present invention is to provide an oil based component for a lithographic printing system in which the water solubility or washability can be selectively controlled by varying the pH of the solution which it contacts.

A still further object of the present invention is to provide a lithographic ink composition which utilizes existing lithographic ink ingredients and which can print lithographically and be washed from the print blanket, rollers, etc. with an aqueous wash.

A further object of the present invention is to provide a method for making, using and recovering an oil based or water insoluble ink composition, including lithographic, nonlithographic and radiation curable ink compositions, of the type in which the water solubility or washability can be selectively controlled.

These and other objects of the present invention will become apparent with reference to the description of the preferred composition and method and the appended claims.

DESCRIPTION OF THE PREFERRED COMPOSITIONS AND METHODS

The general concept of the present invention involves formulation of ink compositions with water reducible resins and more particularly unneutralized water reducible resins. This concept is applicable to both lithographic and nonlithographic ink compositions as well as oleoresinous and radiation curable ink composition systems. Benefits in addition to the water washability of the ink can be achieved for certain formulations in accordance with the present invention. These benefits include improved ink life, without adversely affecting and in some cases improving set. This results from the use of oleic or other fatty acids and the ability to formulate ink compositions with the elimination or dramatic reduction of volatile petroleum solvents. The preferred embodiment is described with respect to a lithographic application although all concepts of the present invention are also applicable to nonlithographic inks. Specific description of a radiation curable application is also provided. Working examples are provided for all applications.

Lithographic Application

A preferred embodiment relates to oil based or water insoluble ink compositions and is described with respect to off based or water insoluble lithographic compositions usable in a lithographic printing process. The present invention also relates to various methods involving the making, using and recovery of such compositions. As set forth above, lithography is based on the concept of providing a printing plate having oleophilic (oil attracting) and oleophobic (oil repelling) areas and applying an oil based or water insoluble component and an aqueous component to such printing plate whereby the oil based component is attracted to the oleophilic areas and the aqueous component is attracted to the oleophobic (or hydrophilic) areas. Conventional lithographic ink compositions are oil based, while the so-called fountain solutions are aqueous. This necessarily dictates use of an organic or other nonaqueous solvent when washing or cleaning the printing plates, rollers, blanket cylinder, ink train or other print components.

The preferred ink composition of the present invention is an oil based or water insoluble lithographic ink which is insoluble in water under certain conditions, but which can be selectively converted to exhibit water solubility or washability at certain other conditions. More specifically, the preferred ink composition is water soluble at certain selected pH levels while being water washable at certain selected other pH levels. As used herein, the term "washable" or "water washable" refers to a composition or component which can be removed or dispersed when exposed to certain aqueous solutions, including alkaline solutions. It should be noted that in the present application "solubility" is not necessarily equated with "washability". A composition that is soluble would certainly be washable; however, the converse is not necessarily true. To be washable, a composition must be capable of removal or dispersion, either physically or through means of solubility.

Although the preferred ink composition of the present invention is oil based or water insoluble, it is contemplated that the concept of the present invention could also apply to a lithographic system in which the ink composition is aqueous based and the fountain solution is oil based or water insoluble. In such a system, the fountain solution would be water insoluble under certain conditions or at certain pH levels and water soluble or washable at certain other conditions or pH levels. As will be described in greater detail below, it is also contemplated that an oil based or water insoluble ink composition in accordance with the present invention will have applicability to print processes other than lithography, including letter-press, gravure, flexographic and intaglio, among others. Additionally, the inks of the present invention will be applicable to "waterless" lithography in which special plates are used which are treated to allow one to practice lithography without the use of a fountain solution. Accordingly, unless otherwise specifically stated, the present invention contemplates applicability to both a conventional oil based or water insoluble lithographic ink composition system as well as a possible water based lithographic ink composition system and also an oil based or water insoluble ink composition useful in print processes other than lithographic.

In general, lithographic ink formulations comprise a variety of components or ingredients including a varnish or vehicle component, pigments, solvents or diluents and various additives. The pigments, solvents or diluents and additives provide the ink composition with certain desirable characteristics such as color, drying speed, tack, viscosity, etc. These may be considered optional, depending upon the particular characteristics desired. Pigments or coloring agents may induce organic and inorganic pigments and dyes and other known colorants. Solvents or diluents are principally used to control viscosity, improve compatibility of other components, among others. Additives and other auxiliary components may include, for example, waxes, greases, plasticizers, stabilizers, drying agents, supplemental drying agents, thickeners, Fillers, inhibitors and others known to the art.

The major component of a lithographic ink composition is commonly referred to in the industry as the lithographic ink varnish or vehicle. A lithographic ink varnish or vehicle comprises two principal components: a resin component and an oil or diluent component. As used herein, the term resin is used in its broadest sense to include all natural and synthetic resins capable of functioning as a component in a printing or printing ink environment. In the ink composition of the present invention, the varnish, and in particular the resin component, is formulated to provide the ink composition with the characteristic of being selectively water insoluble at certain pH levels and water soluble or washable at other pH levels.

Lithographic ink varnishes may be divided into two major classes depending upon the system of curing or drying the inks. The first system is an oleoresinous system which is generally used to produce quick set, heat set, and various other drying inks which set or dry by oxidation, absorption of the oil into the substrate, or solvent evaporation. The second system is known as an acrylic system which employs ultraviolet, electron beam or other radiation curing techniques. In an oleoresinous system, the vehicle is comprised of resins and oils or solvents; in radiation curable inks, these are replaced by polymerizable components such as acrylate functional oligomers and monomers known in the art. In a radiation curable system, the monomers are commonly referred to and function as diluents. The concept of the present invention is applicable to both systems; however, the preferred composition is described with respect to an oleoresinous system, while the concept as applied to a radiation curable system is described in a separate section below.

The oil or diluent component of the ink composition or varnish of the preferred embodiment may be any one of a variety of oils or oil derivatives which are commonly used in the formulation of lithographic inks. Preferably these include, but are not necessarily limited to, vegetable and other oils such as linseed, soybean or soya, castor, dehydrated castor, corn, tung, carnuba and otticita oils. Certain petroleum distillates or mineral oils can also be used in combination with or in lieu of the vegetable oils. An example of such a petroleum distillate is a solvent known as a Magic solvent which is a $C_{12}$ to $C_{16}$ hydrocarbon solvent. Fatty acids can also be used. Examples of suitable fatty acids include oleic, linoleic or tall oil fatty acids. The pH or diluent component of the ink composition or varnish functions principally to dissolve and act as a carrier for the resin component. Thus, a principal requirement of the oil component is that it be compatible with, and therefore able to dissolve or be miscible with, the resin component. Various oils and oil formulations which are usable in ink compositions and in particular lithographic ink compositions are well known in the art as disclosed for example in *The Printing Ink Manual*, Fourth Edition (1988) edited by R. H. Leach and published by Van Nostrand Reinhold, the substance of which is incorporated herein by reference. Preferably the oil or diluent component of the ink varnish should comprise about 10% to 90% by weight and most preferably about 30% to 70% by weight.

The resin component in a lithographic ink composition or varnish functions, among other things, as a film former to bind the varnish and pigment together and, when the ink dries, to bind the same to the receiving substrate. The resin component also contributes to the properties of hardness, gloss, adhesion and flexibility of an ink and must be compatible with the oil or diluent component of the varnish. In conventional oleoresinous systems, the resin component is commonly comprised of a first or hard resin component and a second resin component which typically is an alkyd or polyester resin, but which can comprise various other compositions and resins as well. Preferably the ink composition of the present invention also comprises a two resin component system; however, as will be described in greater detail below, this is not a requirement.

For a two resin component system in accordance with the present invention, the first or hard resins are normally solid at room temperatures, are water insoluble regardless of the pH of the solution to which they are exposed, and typically fall into two principal classes: the modified rosin ester resins and the modified hydrocarbon resins. Various hard resins or hard resin combinations or blends can be, and have been, utilized in the ink composition of the present invention providing such resins are compatible with each other, with the oil and with the alkyd, polyester or other resin components of the varnish. As used herein, compatibility means generally soluble or miscible with one another. Hard resins usable in lithographic inks of the present invention may be comprised of natural or processed resins such as rosins, rosin esters, maleic modified resins, rosin modified fumaric resins, dimerized and polymerized rosins, asphalts such as gilsonite and the like, phenolics, rosin modified phenolics, terpenes, polyamides, cyclised rubber, acrylics, hydrocarbons and modified hydrocarbons. Also included among the available resins are those identified in *The Printing Ink Manual*, supra, the substance of which is incorporated herein by reference.

The second resin component for a two resin component ink composition or varnish of the present invention, like the hard resins, functions to form the varnish or ink composition into a cohesive material and, upon printing, bond the pigment to the receiving substrate. However, unlike the hard resins described above, this second resin component is typically not solid, but is a viscous liquid. Further, unlike resin components of conventional lithographic inks, this resin component in accordance with the present invention is formulated or selected to exhibit selective water solubility or washability behavior as a function of pH. This portion of the ink or varnish composition is hereinafter referred to as the solubility controlling portion or component of the system.

Although a two resin component system is preferred for the ink compositions of the present invention, a single resin component system incorporating the concept of the present invention can also be formulated. In the single resin component system, the entire resin component is comprised of a resin or combination of resins, all of which exhibit selective water solubility or washability as a function of pH. Thus, regardless of the type of resin system, the present invention requires at least a portion of the resin component to include a resin whose water solubility or washability behavior is pH dependent.

Alkyds and various other resins for conventional lithographic inks are normally "cooked" so as to have all or substantially all of the acid groups reacted with all or substantially all of the hydroxyl groups. This results in a product having very low hydroxyl (OH) and carboxyl (COOH) content with an Acid Number (AN) for these particular resins less than 20 and often less than 10. The Acid Number of a particular material is one accepted measure of acid functionality and is defined as the amount of potassium hydroxide (KOH) in milligrams (mg) required to neutralize one gram of the material tested. Acid Numbers of conventional lithographic ink components, and in particular those of the resin components, are minimized to reduce the ionic behavior of the composition and thereby increase the overall stability and water insolubility of the ink.

In accordance with the preferred embodiment of the present invention, it has been found that under acidic conditions, certain ink compositions can be formulated which remain sufficiently stable (i.e. sufficiently nonionic and water insoluble) to be useful as a lithographic ink and provide highly acceptable print quality, yet which may be readily and selectively converted to a water soluble or washable form upon a shift to alkaline conditions. This allows the lithographic ink having such qualities to be printed using an acidic aqueous fountain solution and cleaned up using an alkaline aqueous wash solution.

The characteristics of a lithographic ink composition relating to water solubility or insolubility and stability are directly related to the resin component of the system which in turn are directly related to the characteristics of the solubility controlling portion of the resin component. In accordance with the present invention, the ink composition, and thus the solubility controlling portion of the resin component, should preferably be water insoluble under certain conditions and water washable at others and such water solubility behavior should be pH dependent. In the preferred embodiment, this solubility controlling portion is comprised of a water reducible resin exhibiting the desired solubility characteristics. By selecting such resin which is both compatible with the other varnish components and exhibits the desired solubility behavior to render it water insoluble at certain pH levels and water soluble or washable at certain others, it has been found that the resulting resin component, varnish and ink composition exhibit similar characteristics.

The water solubility characteristics of a water reducible, acid functional resin, and thus the water solubility characteristics of the resulting varnish and ink composition, are determined to some extent by appropriate selection of the Acid Number of such resin. More specifically, the water reducible resin and its particular Acid Number are selected so that such resin is water insoluble at certain acidic pH levels, while being water soluble or water washable at certain other alkaline pH levels.

As used herein, the term water reducible defines a property of a resin or composition which enables such resin or composition to be substantially water insoluble under certain conditions (preferably pH related) and capable of being or becoming water soluble or water washable or dispersible under certain other conditions (preferably pH related). In accordance with the preferred embodiment, the term water reducible defines a resin or composition whose water solubility behavior is pH dependent, with such resin or composition being water insoluble under acidic conditions and water washable under alkaline conditions.

The Acid Number of an acid functional resin is one measure of that particular resin to exhibit water reducible properties, (i.e.), the ability to be water insoluble at certain acidic pH levels and water soluble or washable at certain alkaline pH levels. The Acid Number at which a particular resin will exhibit water reducible behavior, however, varies from resin to resin. Some, such as certain alkyds, polyesters, polyolefins, epoxy esters, rosin derivatives and modified oils, will exhibit water reducible behavior at relatively low Acid Numbers in the range of about 25 to 200. Others, including certain modified rosins such as phenolics, maleics, fumaric and pentaerythritol esters, certain synthetic hydrocarbons as well as unmodified rosin and derivatives thereof, exhibit water reducible behavior only at relatively high Acid Numbers greater than 200, if at all. Regardless of the particular type of resin, however, the Acid Number at which such resin exhibits water reducible behavior will depend on the particular formulation of that resin.

For ink compositions in accordance with the present invention, the Acid Number of the water reducible resin must be sufficiently high to provide such resin with water reducible characteristics. Preferably this is at least about 25 and more preferably about 30. However, since the Acid Number of a resin also impacts, to some extent, the compatibility of the resin with the oil or solvent component of the varnish and its stability with respect to aqueous fountain solutions, the water reducible resin, or at least a major portion of the water reducible resin, for lithographic compositions should have an Acid Number sufficiently low to render it compatible with the oil component and to provide it with sufficient stability under acidic conditions to enable it to print lithographically. Although limited amounts of water reducible resins with high Acid Numbers (less than about 10% by weight of the varnish) can be tolerated, the major portion of the water reducible resin, for lithographic purposes, should preferably have an Acid Number less than about 200 or in the range of about 25 to 200. More preferably this Acid Number range should be less than about 150 and most preferably less than about 100. For ink compositions other than for a lithographic application, no upper limit for the Acid Number exists; however, the resin must have an Acid Number which causes it to exhibit water reducible behavior. In the case of alkyds, the Acid Number is reported for the entire molecule, including both the resin and oil portions combined.

For the solubility controlling portion of the resin component to cause the resulting varnish or ink composition to exhibit the desired water solubility characteristics or behavior, such solubility controlling portion must be present in an amount effective to result in such behavior. This will depend to some extent on the particular water reducible resins employed. In general, the lower the Acid Number at which the resin exhibits water reducible behavior, the better the clean up. For certain resins such as alkyds and oil modified resins, among others, the oil component can be and often is considered as a part of the resin molecule. In such cases, certain formulations of the water reducible resin can be present in an amount up to 100% by weight of the varnish. For other water reducible resins, including the alkyds and oil modified resins, such solubility controlling portion, and in particular the water reducible resin, should be present in an amount of at least about 5% and more preferably between about 5-60% by weight of the varnish (the oil and resin components). Most preferably, the solubility controlling portion should be present in an amount at least about 10% or between about 10-40% by weight. For most of the water reducible resins usable in the present invention, the entire resin molecule, including the oil portion, is considered as the resin for this particular purpose. Further, for lithographic applications it is preferable that at least 5% or about 5-60% by weight of the varnish be comprised of a water reducible resin with an Acid Number less than 200, more preferably less than 150 and most preferably less than 100.

Optionally, a compatible surfactant can be used in combination with the water reducible resin. Use of such a surfactant will tend to reduce the amount of water reducible resin which is needed to render the ink composition or varnish water washable, without adversely affecting the print quality. Accordingly, with the use of a surfactant in combination with the water reducible resin at the concentrations discussed below, the water reducible resin can be present in an amount as low as 2% and preferably between about 2-60% by weight of the varnish (the oil, resin and surfactant components).

Various anionic, cationic, nonionic and amphoteric surfactants will be acceptable as a component of the ink composition of the present invention provided the surfactant is compatible with the other components of such composition and in particular the oil and resin components. It has been shown that various anionic surfactants (Emphos PS-400 manufactured by Witco Chemical Co.), cationic surfactants (MQuat 1033 and Mazeen C-5, both manufactured by PPG Industries, formerly Mazer Chemical Co.) and nonionic surfactants (Surfonyl 104 manufactured by Air Products and Mazawet 77 and Macol NP4, both manufactured by PPG Industries, formerly Mazer Chemical Co.) have been shown to be acceptable for use in accordance with the present invention. The present invention, however, is not limited to these particular surfactants. Use of compatible surfactants as a part of the ink composition has the effect of improving the water clean up for a particular amount of water reducible resin, without adversely affecting the print quality of the ink. Alternatively, use of compatible surfactants provide comparable water clean up with reduced amounts of the water reducible resin, while still maintaining acceptable print quality. Use of the surfactant however, is optional.

If a surfactant is used, the particular preferred or optimum amount of water reducible resin and surfactant in the varnish will depend upon various factors which include, among others, the particular components in question, the other components of the varnish and the desired clean up and print quality properties of the ink composition. In general, reduction of the amount of water reducible resin will require an increased amount of surfactant to achieve comparable clean up properties. Preferably for water reducible resin concentrations in the amounts set forth above, the ink composition varnish should include surfactant concentrations in the amount of 1%–20% by weight. More preferably, the surfactant concentrations should be 2%–15% by weight and most preferably 5%–10% by weight.

The oil portion of a particular alkyd or other resin will depend on the particular molecular structure. In general, however, the oil portion of alkyds and certain other resins will range from about 10% to 90% by weight. Alkyds are classified as long, medium or short oil alkyds depending on the quantity of oil reacted into the resin backbone. Below 50%, the alkyd is a short oil alkyd, between 50–65% the alkyds are medium oil alkyds, while above 65%, the alkyds are long oil alkyds.

It is also contemplated that in accordance with the preferred embodiment, the solubility controlling portion of the resin may comprise either a single water reducible resin or a blend of two or more such resins which exhibit the desired water solubility characteristics or behavior of being water insoluble under certain conditions or acidic pH levels and water washable under certain other conditions, preferably alkaline pH levels. It is contemplated that numerous water reducible resins currently exist or can be formulated to meet the requirements of the present invention. Many of these have been tested in lithographic or other printing environments. Specifically, it has been shown that certain water reducible alkyds (Cargill's short oil alkyds 74-7450, 74-7451; Cargill's long oil alkyd 74-7416; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable provided they are compatible with the other components of the system and are present in an amount sufficient to cause the varnish and ink composition to exhibit similar characteristics. The most preferred resins are the water reducible alkyds and water reducible polyesters. All of the above are compatible with castor oil except for Cargill's modified linseed oil 73-7319 which is compatible with linseed and soya oil and Magie solvent. Cargill's short oil alkyd 74-7451 is additionally compatible with linseed and castor oils.

For the water reducible resins and for the ink compositions or varnishes incorporating such resins as described above, water solubility or washability characteristics depend on the pH of the aqueous solution with which such compositions come into contact. Using the preferred water reducible resins of the present invention, such resins and the resulting compositions or varnishes are water insoluble at a first acidic pH level less than 7.0. Preferably the pH of the solution to which the composition will come into contact in its insoluble form is between about 3.0 and 6.5 and most preferably between about 4.0 and 5.5. The second pH level at which the water reducible resin and resulting ink composition or varnish becomes water soluble or washable is an alkaline pH having sufficient basic strength to substantially neutralize the acid groups of the water reducible resin. Preferably such pH is between about 8.5 and 14 and most preferably between about 10.5 and 13.

The ink composition or varnish of the present invention includes an excess of free acid groups by virtue of the presence of the water reducible resin with an Acid Number greater than about 25. In some ink composition formulations, certain compatible hard resins or other components can be selected which contain functional groups which can react with or tie up the free acid groups of the water reducible resin. Generally, such effect is minimal. In any event, the effective Acid Number of the solubility controlling portion, after combination with the other ink composition or varnish components, must be sufficient to result in the desired solubility behavior.

Addition of a source of hydroxy or other basic ions to the above ink composition or varnish results in the solubility controlling portion, and thus the ink composition, being converted to a water soluble or at least a water washable or dispersible form. Such source of hydroxy or other basic ions is provided in accordance with the present invention by an alkaline wash solution. The alkaline strength of such wash should be sufficient to render the solubility controlling portion, and thus the ink composition, water washable or dispersible at normal operating or ambient temperatures. Although applicant does not wish to be held to any particular explanation of this conversion, it is believed that the hydroxy or other basic ions react with or neutralize the free acid groups of the water reducible resin, thereby rendering the same water washable or dispersible. This behavior of the solubility controlling portion is then sufficient to render the entire ink composition water washable or dispersible. The present invention contemplates an ink composition which is substantially water insoluble at acidic pH conditions and is printed at those conditions. Thus, the water reducible resins used in the composition should not be preneutralized, but should exist in the ink composition in their unneutralized or substantially unneutralized or acidic form. By being unneutralized, the resins exhibit the required water reducible behavior and minimize interactions with the fountain solution during a lithographic application.

In general, the more alkaline the wash solution, the quicker and more effective the ink composition will be removed or dispersed. As set forth above, a wash solution with a pH of between about 8.5 and 14 and preferably between about 10.5 and 13 is effective to clean up blanket cylinders and rollers containing ink compositions of the present invention by use of a rag or towel dipped in the wash solution.

A wide range of alkaline cleaning agents or wash solutions can also be employed with the inks and ink compositions of the present invention. The principal property of such solutions is that they have a pH or source of hydroxy or other basic ions sufficient to convert the solubility controlling portion, and thus the ink composition to a water soluble or washable condition. The preferred wash solution contains sodium hydroxide as the hydroxy ion source; however, various other alkaline solutions can be used as well including, without limitation, solutions of the alkali metals, alkaline earth metals, organic amines, ammonium, quaternary ammonium, etc. The use of surfactants, cosolvents and other additives common to the industry may also be used as a part of the wash solution. These tend to reduce the pH or the amount of wash needed to obtain acceptable wash results. Selection of the appropriate surfactant will depend on the particular composition. An example of a surfactant which may be used is a nonionic surfactant made by Mazer Chemical and sold under the tradename Mazawet 77. Certain other nonionic, cationic and anionic surfactants may be used as well.

Although the preferred embodiment has been described specifically with respect to the water solubility control of a water reducible resin, it is contemplated that multiple components of the resin system, including the entire resin component itself, may be selected to provide the desired water solubility characteristics. In accordance with the present invention, however, such portions or components must be compatible with each other and with the remainder of the system, must meet the other requirements of the lithographic or other print system including print quality requirements and must, after combination with the other composition components, exhibit aqueous solubility changes in response to changes in pH of the solution with which it is contacted.

The particular pigments, solvents, diluents and other common additives do not appreciably affect the effective free acid associated with the solubility controlling portion and thus the water solubility/insolubility behavior of the resulting ink composition.

Fountain solutions useful with the ink composition of the preferred embodiment include all commercially available acidic solutions. Preferably, such solutions should be chosen which have a working strength pH less than 6.5, and more preferably less than about 5.5. Additionally, certain fountain solution additives, such as isopropyl alcohol, alcohol substitutes, antipiling additives and the like can be used successfully with the compositions of the present invention.

In addition to providing aqueous clean up properties to substantially water insoluble inks, the use of unneutralized water reducible resins in combination with oleic or other fatty acids and/or in combination with various hard resins leads to further improved ink properties. Combination of a water reducible resin with oleic or other fatty acids unexpectedly increases the ink life without sacrificing ink set, while combination with hard resins, preferably higher acid value resins, unexpectedly facilitates reduction of solvents and in particular volatile solvents.

Generally, the properties of ink set and ink life are balanced since conventional inks which set quickly have a short life on the press. Conversely, conventional inks which have a long life on the press will take longer to set. In certain ink formulations of the present invention, oleic or other fatty acids are used as solvents for the water reducible resins and, if present, other hard resins as well. Accordingly, the oleic and other fatty acids used in the present compositions replace the function of volatile petroleum solvents in conventional inks.

This leads to several beneficial ink properties. First, because the oleic and other fatty acids are substantially nonvolatile, the ink exhibits improved life on the press because of less solvent or diluent loss due to evaporation. This property of oleic and other fatty acids also results in reduced solvent evaporation and thus improved environmental acceptability after the ink has been absorbed into the paper. Second, in some ink formulations, the presence of oleic and other fatty acids results in at least comparable, if not improved, set times when compared to conventional volatile petroleum solvents. One possible explanation for this result is the increased affinity of oleic and other fatty acids for the paper substrate, thus resulting in faster absorption. Another possible explanation is that the bifunctional fatty acids react with or are neutralized by components of the substrate, thus resulting in precipitation and setting of the ink. Regardless of the mechanism, ink compositions have been formulated with oleic acid in which the ink life has been increased by a factor of as much as three or more without sacrificing the ink set properties. Other fatty acids include palmitoleic, steric, linoleic and tall oil acids, among others.

Improved ink performance, and particularly improved ink life, can be achieved with minimal amounts of oleic or other fatty acids; however, such fatty acids should preferably be present in the ink varnish in an amount of at least 1% by weight and more preferably at least 5%. Further, it has been found that improved ink set can be obtained by selection of water reducible resins having decreased amounts of vegetable oil reacted into the resin backbone. For example, by using short oil water reducible alkyds in combination with oleic and other fatty acids, shorter set times can be achieved when compared to conventional inks.

It has also been found that by combining an acid functional, unneutralized water reducible resin with certain hard resins, improved solubility and viscosity properties can be achieved without a corresponding increase, and in some cases a decrease, in volatile solvent content. Various prior art ink compositions, and in particular conventional heatset inks, are designed to function by resin solubility in solvent. These inks are formulated with resins which have limited solubility in the petroleum solvents being used. As solvent is evaporated, the resin becomes insoluble and precipitates causing the ink to set. Because solubility in petroleum solvent is strongly influenced by the molecular weight of the resin, the heatset technology has moved toward higher molecular weight resins, which enhances the setting mechanism of the ink. Unfortunately, increased molecular weight also increases the viscosity of the resultant inks. Thus increased amounts of solvent are required to achieve viscosity which is sufficiently low for printing. This in turn increases the environmental impact and cost of the process.

Certain ink compositions of the present invention rely on acid functionality of the resin or resin system rather than molecular weight to control the solubility properties of the resin. As acid number of the resin increases, the polarity of the resin increases and its solubility in nonpolar petroleum solvent decreases. Since solubility and viscosity are generally inversely proportional, poor solubility results in higher viscosity which would normally require increased solvent content. The inks of the present invention, however, eliminate this problem by using water reducible resins to solubilize the hard resins in petroleum solvents, thereby resulting in inks which maintain the precipitation mechanism at lower viscosities and with reduced volatile solvent.

The ability to control solubility via the acid functionality of the resin results from the discovery that when acid functional, water reducible resins are combined with certain hard resins, and in particular higher acid value resins, unexpected viscosity reduction of the combination is obtained. For example, it has been shown that, at the same solvent level, the viscosity of the combination of a water reducible resin and a hard resin is equal to or lower than the viscosity of either of the individual resins at the same solvent level or at least lower than the viscosity which would have been expected from the combination. Thus, to achieve a desired varnish viscosity, less solvent is needed for a combination of a water reducible resin and a hard resin than is needed to achieve the same viscosity for either of the resins alone. This has been shown over a wide range of resin concentrations and facilitates the formulation of inks with reduced solvent content. This effect on the viscosity of the resin combination becomes more dramatic as the acid number or value of the hard resin increases. Thus, although a variety of hard resins, when combined with an acid functional water reducible resin, will result in lower than expected viscosity, higher acid value resins are preferred. In particular, hard resins with acid numbers greater than 15, and more preferably greater than 40 and most preferably greater than 80 will provide the greatest viscosity reduction. Examples of available hard resins include the fumarics, maleics, phenolics and hydrocarbon resins. Although certain levels of viscosity reduction can be achieved with minimal amounts of hard resin, it is preferable that at least 5% and more preferably 10% by weight of the hard resin be present in the varnish. The viscosity reduction effect can be further increased by using oleic or another fatty acid as a portion of the solvent. Further, for certain ink formulations such as when Magie or other petroleum solvents are needed, increased oil length of the water reducible resin will improve compatibility with such solvents.

In addition to the lithographic ink composition or varnish described above, the present invention relates to various methods based upon an ink composition or varnish which is water insoluble at certain conditions and water soluble or washable at certain other conditions. Specifically, the method aspects of the present invention include a method or process for making an ink composition or varnish, a method or process of printing and a method or process of recovering ink composition residue from a printing operation.

The method of making an ink composition in accordance with the present invention comprises the steps of combining an oil diluent component and a resin component wherein such resin and oil components are compatible and wherein the resin component is selected and formulated to be substantially water insoluble at certain conditions and water soluble or washable at certain other conditions. More specifically, the above method involves a resin having a solubility controlling portion, and preferably a water reducible resin component in which the water solubility of such resin is such that it is substantially water insoluble at certain acidic pH conditions and water soluble or washable at certain other alkaline pH conditions. Most preferably the water reducible resin is a water reducible alkyd or polyester. Further, for a lithographic ink composition, such solubility controlling portion preferably includes sufficient free acid groups to provide it with an Acid Number of about 25–200 and preferably about 30–100.

The combination of the components in the preparation of a lithographic ink composition is standard in the art. Such combination generally includes charging the various varnish components (the oil and resin components) into an agitated vessel, heating the components to a temperature and for a duration sufficient to melt any hard resin components and sufficient for the oil to dissolve the resin. The combination is then normally cooled to room temperature. Various pigments, diluents and other additives may then be combined. Generally, the temperature must be above the glass transition point of the hard resins which is usually in the range of about 300° to 500° F. (189° to 260° C.). The duration of heating or "cooking" is generally about 20–30 minutes. The details of such a process are known in the art.

The method aspect of the present invention also relates to a method of printing and in particular a method of lithographic printing. Generally, such method includes applying the substantially water insoluble ink of the present invention to a printing plate or other print application equipment, transferring such ink to a desired print receiving substrate or medium and then cleaning up or washing the printing plate or other application equipment using an aqueous alkaline wash. For lithographic printing, the method includes applying an oil based component and a water based component to a printing plate in which one of the components is an ink composition and the other is a fountain solution, transferring the ink composition to a desired medium, and then washing the oil based component with a wash solution having a pH different than that of the water based component. More specifically such method includes the steps of first applying an oil based lithographic ink composition and an aqueous fountain solution to a lithographic printing plate in which the ink composition is water insoluble at acidic pH conditions and water soluble or washable at alkaline pH conditions and in which the aqueous fountain solution has a selected acidic pH in which the oil based lithographic ink composition is generally insoluble. The printing plate has oleophilic and oleophobic areas to receive the ink composition and the aqueous fountain solution, respectively. The ink composition which is received by the oleophilic areas of the printing plate is then transferred from the printing plate to a receiving medium. This can be a sheet of paper or other substrate such as in a direct printing method or can be a blanket positioned on a cylinder such as is common in an offset method.

The final step in the method of using the lithographic ink composition is to wash or clean the printing press or other print components with an aqueous wash solution having a selected alkaline pH at which the ink composition is soluble or washable. Preferably, the fountain solution is acidic with a pH of less than 7.0, more preferably less than 6.5 and most preferably less than about 5.5 and the wash solution is alkaline with a pH greater than 7.0, preferably greater than 8.5 and most preferably greater than about 10.5.

A further aspect of the method of the present invention is a method of recovering the ink composition residue from a printing apparatus, preferably for disposal purposes. Such recovery method can be used in any printing process to recover the oil based component or the residue thereof, but has particular applicability to a lithographic process which utilizes an oil based lithographic ink composition which is water insoluble at selected first pH levels and water washable at selected second pH levels. The recovery method is applied after a lithographic process has been completed, or when an ink change or printing plate change is desired. The process includes removing the lithographic ink residue from portions of the print apparatus. Such apparatus can include one or more of the ink train, the printing plate, the rollers, the blanket cylinder or various other components which are exposed to the ink composition. The ink residue is removed using an aqueous wash solution with a pH effective to convert the ink composition, and thus the ink residue, to a water soluble or water washable form. In the preferred method, the wash solution is alkaline and has a pH greater than 7.0, preferably greater than 8.5 and most preferably greater than about 10.5. Application of the wash to the blanket is commonly accomplished with a shop towel dipped in the wash solution.

The washing step results in the formation of a mixture of ink residue and wash solution. The pH of this mixture is then modified to a pH which is generally acidic and effective to render the ink residue water insoluble. This results in the ink residue precipitating or otherwise separating from the water phase and facilitates removal of the residue through centrifugation, filtration or various other techniques known in the art. The wash from which the residue has been removed can then preferably be readjusted to the desired pH and reused as wash solution. The shop towels which contain ink residue can also be cleaned in a similar manner to remove the ink residue.

Nonlithographic Application

The concepts of the present invention described above with respect to lithographic printing are also fully applicable to nonlithographic printing processes and inks. Nonlithographic processes include letterpress, gravure, flexographic and intaglio, among others. Ink properties such as water stability, viscosity, etc. can be formulated for any of the lithographic or nonlithographic processes while still obtaining the ink composition and method benefits of the present invention. Various working examples of nonlithographic inks are set forth below.

Radiation Curable Ink Compositions

In addition to the oleoresinous systems described above, the concept of the present invention can also be used with radiation curable inks. Conventional radiation curable ink compositions include oligomers and monomers, one or both of which are commonly referred to as pre-polymers. Most such compositions also include initiators (when needed) and various pigments, additives and inhibitors to provide the ink composition with the desired color and other physical and functional characteristics. Commonly, the oligomers and monomers are referred to as the ink vehicle and function to carry and disperse the pigment and to form the Film on the substrate, when printed. In addition to these common components, the ink composition also includes a water reducible resin component which is compatible with the oligomers, monomers and other components of the ink system and which exhibits selective water solubility behavior as a function of pH. Further, the water reducible resin exists in the ink composition in its unneutralized or substantially unneutralized form so that the ink composition in its printable form is water insoluble or substantially water insoluble.

The various oligomers, monomers, initiators and other additives which are common in conventional radiation curable inks are also usable in the ink compositions defined by the present invention. Specifically, the oligomers common to radiation curable inks and to the composition of the present invention may be any of the acrylate, polyester, urethane or other systems such as thiol/nen, epoxy or vinyl ether systems. The oligomers are normally highly viscous and function as a binder in the ink vehicle or varnish and thus the ink composition. The preferred oligomers in accordance with the present invention, however, are acrylate formulations. Examples include the acrylate esters and specifically epoxy acrylates, polyester acrylates, unsaturated polyesters and urethane acrylates. Such components are well known in the art and are available from a variety of sources. Specific reference in this regard is made to *The Printing Ink Manual*, supra.

The monomer component of the vehicle and ink composition is also similar to those conventionally used in the formulation of radiation curable inks. The selection of the appropriate monomer for an ink system is governed by various functional aspects of the monomer including its viscosity, cure rate with the oligomer, tack as well as various health and safety aspects. The monomers are usually low viscosity liquids which assist in defining the viscosity of the ink composition in combination with the relatively viscous oligomers.

Common monomers for conventional radiation curable inks as well as the compositions of the present invention include tripropylene glycol diacrylate (TPGDA), n-vinyl pyrollidone and Dianol diacrylate and its analogs. The above monomers have been used extensively in environments where health and safety concerns exist. In those areas where health and safety are not as important, 1, 6-hexanediol diacrylate (HDDA) is one of the most common monomers available. Trimethylol propane triacrylate (TMPTA) has also been used extensively in lithographic applications and exhibits high reactivity and reasonable viscosity. Other monomers usable in radiation curable inks are known in the art and are available from a variety of sources, including The Printing Ink Manual, supra.

Because the oligomers and the monomers of a radiation curable ink or varnish substantially define the physical properties of the ink composition, both prior and subsequent to printing, selection of the appropriate oligomer and monomer should be made with this in mind. In this regard, properties such as viscosity, tack, cure rate, adhesion, gloss, and durability are controlled principally by the selection of these components. These components will also vary to some extent depending upon the printing process for which the ink composition is to be used and the particular physical properties which are desirable for such process. The selection of these components for particular printing applications are known in the art.

Radiation curable inks and in particular radiation curable inks of the present invention also require a mechanism for initiating the free radical polymerization of the pre-polymers. This mechanism in turn depends upon the system which will be used to cure the ink composition. If ultraviolet (UV) radiation is used to initiate the free radical polymerization, a photoinitiator is required in the ink composition. If electron beam (EB) curing is utilized, photoinitiators are not needed.

Since EB curing does not require photoinitiators, EB curing is commonly preferred since it substantially eliminates unreacted residue. EB curing does, however, require substantial capital investment. In a UV curing system, the photoinitiators present in the ink composition are normally not totally incorporated into the cross-link network. Thus, they are generally present at significant levels in the cured film either in their original or other volatile form. This can be a source of concern depending upon the particular photoinitiator used, and in some cases dictates the need for EB curing rather than UV curing.

Energy sources usable in creating the free radicals and thus curing the ink compositions of the present invention are those which are well known and conventional in the art. For EB curing, this includes conventional electron beam equipment such as linear cathode types. UV generating equipment commonly includes UV lamps which function to provide radiation sufficient to activate the photoinitiators and generate the free radicals needed for polymerization. Examples of UV generating equipment include a UGVEX LCU 7500 laboratory UV curing system or a Prime UV model 120/34 manufactured by Prime Systems Inc. Microwave lamps can also be used to provide the activating radiation in certain circumstances.

During curing, the free radicals resulting from the EB or UV system react with the oligomer and monomer system to effect polymerization. The basic mechanism of photoinitiation and photo chemistry is well known in the art. Benzophenone is one of the most commonly used photoinitiators in a UV system. Such compound, however, requires a proton donor such as an amine in order to yield sufficient free radicals. Other photoinitiators known in the art operate without the need of a proton donor and simply undergo fragmentation into reactive species under UV light.

Pigments usable in the ink composition of the present invention may comprise a variety of pigments. Most of the pigments normally used in lithographic or other printing processes are suitable for use in radiation curable systems. Some pigments, because of their ability to absorb UV radiation, can reduce the cure rate. Thus, pigments usable for radiation curable ink compositions and in particular the compositions of the present invention should take this into account. However, pigments are known in the art which have been found to be suitable in radiation curable ink composition systems. Examples of applicable pigments are those set forth in The Printing Ink Manual, supra, and in the examples below.

The additives, inhibitors and other components in a conventional radiation curable system may also be used in formulating inks in accordance with the present invention. The available additives and inhibitors and their particular functions in a radiation curable system are well known in the art. Such components are considered to be optional, depending upon the properties desired in the ink formulation.

In addition to the conventional ink composition components described above, the radiation curable ink composition and vehicle of the present invention, similar to the ink compositions described above in the lithographic and nonlithographic sections, also includes a water reducible resin component which is compatible with the other ink components and which exhibits selective water solubility behavior as a function of pH. The meaning of the term water reducible in this context is identical to that described earlier.

In general, the same types of water reducible resins described above in the lithographic section have been shown to be applicable for radiation curable inks provided such resins are compatible with the other vehicle components. For radiation curable inks, the water reducible resin of the preferred embodiment should be present in an amount of at least about 5% and more preferably about 5–50% by weight of the ink composition vehicle or varnish (the oligomer, monomer and initiator, if any). Most preferably, the water reducible resin should be present in an amount of at least about 10% or about 10–30% by weight. The optimal amount will depend to some extent on the particular water reducible resin being utilized. Further, for radiation curable lithographic applications it is preferable that at least 5% by weight of the vehicle be comprised of a water reducible resin with an Acid Number less than 200, more preferably less than 150 and most preferably less than 100.

Also, similar to the lithographic discussion above, the water reducible resin component of the radiation curable ink may comprise either a single water reducible resin or a blend of two or more such resins which exhibit the desired water solubility characteristics or behavior of being water insoluble at certain acidic pH levels and water washable under certain alkaline pH levels. Numerous water reducible resins currently exist or can be formulated to meet the requirements of the present invention. Many of these have been tested in a lithographic printing environment. Specifically, it has been shown that certain water reducible alkyds (Cargill's short oil alkyds 74-7450, 74-7451; Cargill's long oil alkyd 74-7416; Cook Composite's short oil alkyd 101210), certain water reducible polyesters (Cargill's polyester 72-7203), certain water reducible polyolefins (Cargill's modified polyolefin 73-7358), certain water reducible modified oils (Cargill's modified linseed oil 73-7319) and certain water reducible epoxy esters (Cook Composite's styrenated epoxy ester 100453) exhibit the desired characteristics and are acceptable providing they are compatible with the other components of the radiation curing system and are present in an amount sufficient to cause the vehicle and ink composition to exhibit similar water reducible characteristics. The most preferred resins are the water reducible alkyds and modified drying oils.

To provide an ink composition in accordance with the present invention which is substantially water insoluble and can be printed in that form, but which can be washed or cleaned up using an aqueous solution requires that the water reducible resin be combined with the other ink composition components and exist in the ink composition in its unneutralized or substantially unneutralized form. Thus, the water reducible resin component of the present ink composition must not be preneutralized as is the case in many prior art water based ink compositions, nor must the other ink composition components contain groups which will appreciably neutralize the water reducible resin component. By maintaining the water reducible resin in its unneutralized or substantially unneutralized form, the water reducible resin and the ink composition remains substantially water insoluble and can be printed in that form.

The method of making, using and recovering the radiation curable ink compositions in accordance with the present invention are similar to the methods described above with respect to oleoresinous systems. Further, radiation curable ink compositions of the present invention can be formulated for lithographic use as well as nonlithographic used as shown by the examples below.

Having described the details of the preferred compositions and methods, the following examples will demonstrate the applicability of the present invention to a wide range of printing equipment, plates, ink components, resins, solvents, fountain solutions, and cleaning agents. Unless otherwise specified all percentages are "by weight". In all examples, at least 100 grams of ink composition were prepared.

Examples 1-4 demonstrate the applicability of the present invention to various pigments and dyes presently used in lithographic ink compositions. All ink compositions were produced by cooking the varnish comprised of the hard resin, water reducible resin and oil at a temperature of about 200° F. (93° C.) and for a sufficient period (about 20-30 minutes) to melt the hard resin and cause the oil to dissolve the hard resin and the water reducible resin. The pigment was then added and milled on a laboratory scale three roll mill to adequately disperse the pigment. In these examples, the water reducible resin was a commercially available water reducible alkyd which was solvent stripped. The Acid Number of the alkyd was 47-53. The alkyd in Examples 1-4 was a short oil alkyd containing less than 50% by weight oil. Print tests were conducted on an A.B. Dick 375 offset duplicator fitted with a Dahlgren Chem-Series dampener. Plates were Kodak (Product Code 2984) aluminum and the fountain solution used was Rosos KSP#10AS M-2, with a working strength pH of 5.2. The paper used was Nekoosa 24# Ardor bond white. Print densities were measured using an X-Rite model 418 color densitometer.

The press was run for 300 impressions and stopped every 100 impressions, at which time the blanket was cleaned using water adjusted to pH 13 using sodium hydroxide. At the conclusion of the press test, the rollers were cleaned using water adjusted to pH 13 using sodium hydroxide. The print quality including print density, edge definition and permanency were acceptable.

| Example 1: | Process Black | |
|---|---|---|
| | Technical Grade Rosin (EM Science RX0170) | 33% |
| | Alkyd (Cargill 074-7451) AN 47-53 | 17% |
| | Castor Oil (United Catalyst USP) | 37% |
| | Carbon Black (Cabot Regal 400R) | 13% |
| | Print density: 1.6 | |

| Example 2: | Process Cyan | |
|---|---|---|
| | Technical Grade Rosin (EM Science RX0170) | 36% |
| | Alkyd (Cargill 074-7451) AN 47-53 | 18% |
| | Castor Oil (United Catalyst USP) | 36% |
| | Blue 15:3 (Uhlich color #B1-0500) | 10% |
| | Print density: 1.0 | |

| Example 3: | Process Magenta | |
|---|---|---|
| | Technical Grade Rosin (EM Science RX0170) | 31% |
| | Alkyd (Cargill 074-7451) AN 47-53 | 17% |
| | Castor oil (United Catalyst USP) | 37% |
| | Red 81 (Uhlich color (RD-1143) | 15% |
| | Print density: 1.2 | |

| Example 4: | Process Yellow | |
|---|---|---|
| | Technical Grade Rosin (EM Science RX0170) | 37% |
| | Alkyd (Cargill 074-7451) AN 47-53 | 17% |
| | Castor oil (United Catalyst USP) | 36% |
| | YeHow 12 (Uhlich color #YE-0150) | 10% |
| | Print Density: .9 | |

Examples 5-9 demonstrate the applicability of the present invention to a variety of hard resins. Inks were produced using the standard procedure of first cooking the varnish and then milling in the appropriate pigment as provided in Examples 1-4. All inks set forth in these examples were process black formulas which were evaluated using the procedure set forth in Examples 1-4. The compositions of Examples 5-9 were printed using the fountain solution described in Examples 1-4 and washed up using the wash solution of Examples 1-4. The water reducible resin (the alkyd) in Examples 5-7 was the same as that in Examples 1-4. The water reducible resin of Examples 8 and 9 utilized a water reducible modified linseed oil with an Acid Number of 95-105. The hard resin in Example 9 was a straight hydrocarbon resin known by the trademark Nevroz. The print quality and clean up in all examples were acceptable.

| Example 5: | Varnish Cook Temperature: 330° F. (166° C.) | |
|---|---|---|
| | Maleic ester modified rosin (Unirez 7003 - Union Camp Co.) | 29% |
| | Alkyd (Cargill 074-7451) AN 47-53 | 16% |
| | Castor Oil (United Catalyst USP) | 15% |
| | Oleic Acid (Emersol 213 NF, Henkel Co.) | 27% |
| | Carbon Black (Cabot Regal 400R) | 13% |

| Example 6: | Varnish Cook Temperature: 235° F. (113° C.) | |
|---|---|---|
| | Pentaerythritol ester of rosin (Unitac R-100, Union Camp Co.) | 31% |
| | Alkyd (Cargill 074-7451) AN 47-53 | 17% |
| | Castor Oil (United Catalyst USP) | 16% |
| | Oleic Acid (Emersol 213 NF, Henkel Inc.) | 23% |
| | Carbon Black (Cabot Regal 400R) | 13% |

| Example 7 | Varnish Cook Temperature: 330° F. (166° C.) | |
|---|---|---|
| | Fumaric acid rosin (Unirez 8200 - Union Camp Co.) | 26% |
| | Alkyd (Cargill 074-7451) AN 47-53 | 14% |
| | Castor Oil (United Catalyst USP) | 15% |
| | Oleic Acid (Emersol 213 NF, Henkel Inc.) | 32% |
| | Carbon Black (Cabot Regal 400R) | 13% |

| Example 8: | Varnish Cook Temperature: 265° F. (129° C.) | |
|---|---|---|
| | Phenolic modified rosin ester (Uni-Rez 9266, Union Camp) | 23% |
| | Modified Linseed Oil (Cargill 73-7319) AN 95-105 | 17% |
| | Linseed Oil (Degen Oil OGN/04-14) | 25% |
| | Oleic Acid (Emersol 213 NF, Henkel Co.) | 22% |
| | Carbon Black (Cabot Regal 400R) | 13% |

| Example 9: | Varnish Cook Temperature: 320° F. (160° C.) | |
|---|---|---|
| | Nevroz 1520 | 34% |
| | Magie Solvent 60 | 17% |
| | Vista Solvent 47 (Vista Chem.) | 17% |

| | -continued | |
|---|---|---|
| | Modified Linseed Oil (Cargill 073-7319) AN 95-105 | 19% |
| | Carbon Black (Cabot Regal 400R) | 13% |

Examples 10-13 demonstrate the applicability of the present invention with a variety of ink oils currently used in the lithographic ink industry. Inks were prepared, printed, tested and cleaned up in the same manner as those set forth in Examples 1-4. Acceptable print quality and clean up were accomplished in all cases.

| Example 10: | Varnish Cook Temperature: 200° F. (93° C.) | |
|---|---|---|
| | Rosin (EM Science RX0170) | 36% |
| | Modified Linseed Oil (Cargill 073-7319) AN 95-105 | 16% |
| | Linseed Oil (Degen Oil OGN/04-14) | 18% |
| | Oleic Acid (Emersol 213 NF, Henkel Co.) | 17% |
| | Carbon Black (Cabot Regal 400R) | 13% |

| Example 11: | Varnish Cook Temperature: 200° F. (93° C.) | |
|---|---|---|
| | Rosin (EM Science RX0170) | 36% |
| | Modified Linseed Oil (Cargill 073-7319) AN 95-105 | 16% |
| | Soybean Oil (Continental Mills Con32-00) | 17% |
| | Oleic Acid (Emersol 213 NF, Henkel Co.) | 18% |
| | Carbon Black (Cabot Regal 400R) | 13% |

| Example 12: | Varnish Cook Temperature: 200° F. (93° C.) | |
|---|---|---|
| | Rosin (EM Science RX0170) | 36% |
| | Modified Linseed Oil (Cargill 073-7319) AN 95-105 | 16% |
| | Linseed Oil (Degen oil OGN/04-14) | 17% |
| | Magiesol 47 (Magie Oil Co.) | 17% |
| | Carbon Black (Cabot Regal 400R) | 13% |

| Example 13: | Varnish Cook Temperature: 320° F. (160° C.) | |
|---|---|---|
| | Nevroz 1520 (Neville Chem) | 16% |
| | Rosin (EM Science RX0170) | 26% |
| | Vista Sol 47 (Vista Chem) | 28% |
| | Modified Linseed Oil (Cargill 073-7319) AN 95-105 | 17% |
| | Carbon Black (Cabot Regal 400R) | 13% |

Example 14 demonstrates the applicability of straight polyester resins which are not oil modified as the solubility controlling portion. The polyester resin selected was a water reducible polyester resin with an Acid Number of 50-60. Ink preparation, printing, evaluation and washing was conducted using the procedure set forth in Examples 1-4. Both the print quality and clean up were acceptable.

| Example 14: | Varnish Cook Temperature: 320° F. (160° C.) | |
|---|---|---|
| | Maleic ester modified rosin (Unirez 7003, Union Camp Co.) | 35% |
| | Polyester (Cargill 072-7203) AN 50-60 | 16% |
| | Castor Oil (United Catalyst USP) | 18% |
| | Oleic Acid (Emersol 213 NF Henkel Co.) | 18% |
| | Carbon Black (Cabot Regal 400R) | 13% |

Examples 15-19 demonstrate the use of a variety of other water reducible resins as the solubility controlling portion. In Example 15 the solubility controlling portion was a water reducible short oil alkyd with an Acid Number of 47-53; in Example 16 the solubility controlling portion was a water reducible modified polyolefin with an Acid Number of 25-30; in Example 17 the solubility controlling portion was a water reducible long oil alkyd with an Acid Number of 53-58; in Example 18 the solubility controlling portion was a water reducible styrenated epoxy ester with an Acid Number of 65; and in Example 19 the solubility controlling portion was a water reducible short oil alkyd with an Acid Number of 32. Acceptable print quality and clean up were achieved in all cases.

| Example 15: | Varnish Cook Temperature: 200° F. (93° C.) | |
|---|---|---|
| | Rosin (EM Science RX0170) | 35% |
| | Short Oil Alkyd (Cargill 074-7450) AN 47-53 | 16% |
| | Castor Oil (US Catalyst USP) | 18% |
| | Oleic Acid (Emersol 213 NF, Henkel) | 18% |
| | Carbon Black (Regal 400R, Cabot) | 13% |

| Example 16: | Varnish Cook Temperature: 235° F. (113° C.) | |
|---|---|---|
| | Pentaerythritol ester of rosin (Unitac R-100, Union Camp) | 27% |
| | Modified Polyolefin (Cargill 073-7358) AN 25-30 | 20% |
| | Linseed Oil | 24% |
| | Oleic Acid (Emersol 213 NF, Henkel) | 16% |
| | Carbon Black (Regal 400R, Cabot) | 13% |

| Example 17: | Varnish Cook Temperature: 200° F. (93° C.) | |
|---|---|---|
| | Rosin (EM Science RX0170) | 35% |
| | Long Oil Alkyd (Cargill 074-7416) AN 53-58 | 23% |
| | Castor Oil (US Catalyst USP) | 14% |
| | Oleic Acid (Emersol 213 NF, Henkel) | 15% |
| | Carbon Black (Regal 400R, Cabot) | 13% |

| Example 18: | Varnish Cook Temperature. 200° F. (93° C.) | |
|---|---|---|
| | Rosin (EM Science RX0170) | 35% |
| | Styrenate Epoxy Ester (Chempol 10-0453, Cook Composites) AN 65 | 23% |
| | Castor Oil (US Catalyst USP) | 14% |
| | Oleic Acid (Emersol 213 NF, Henkel) | 15% |
| | Carbon Black (Regal 400R, Cabot) | 13% |

| Example 19: | Varnish Cook Temperature: 200° F. (93° C.) | |
|---|---|---|
| | Rosin (EM Science RX0170) | 37% |
| | Short Oil Alkyd (Chempol 10-1210, Cook Composites) AN 32 | 23% |
| | Castor Oil (US Catalyst USP) | 14% |
| | Oleic Acid (Emersol 213 NF, Henkel) | 15% |
| | Carbon Black (Regal 400R, Cabot) | 13% |

Examples 20-22 demonstrate the applicability of the present invention to a variety of press configurations. Example 20: The ink described in Example 1 was applied to an A.B. Dick 375 offset, sheet fed press fitted with a Dahlgren Chem-Series dampening system. A Kodak #2984 aluminum printing plate was used in conjunction with Rosos KSP#10AS M-2 fountain solution at a pH of 5.2. A total of 20,000 impressions were printed on Nekoosa 24# Ardor bond white paper after stopping every 500 impressions to clean the blanket using ordinary tap water adjusted to a pH of 13 using sodium hydroxide. Clean copies were obtained with acceptable print densities of 1.5 measured with an X-Rite Model 418 densitometer. At the conclusion of 20,000 impressions, the rollers were cleaned using the same solution used to clean the blanket. All clean up and print quality was acceptable.

Example 21: An identical test as described in Example 20 was conducted with the exception that the dampening system was a conventional Dahlgren dampener. The lithographic plates employed were Printware 1440 Electrostatic masters. The fountain solution was A. B. Dick 4-1080 electrostatic fountain solution which included Kelstar HT-100 alcohol replacement additive which ran at a pH of 5.0. Excellent print characteristics were observed as well as clean up characteristics using water adjusted to a pH of 13.

Example 22: The ink described in Example 1 was applied to a Didde Glaisser web press fitted with a conventional Dahlgren dampener. The fountain solution employed was Polychrome PR625 which included Polychrome PR637 alcohol replacement as a fountain solution additive which resulted in a pH of 4.8. The press was run at 500 feet per minute with excellent print characteristics and clean up characteristics using tap water adjusted to a pH of 13.

Example 23 represents an ink composition which was made and tested in accordance with the procedure of Examples 1–4 and which was also printed commercially on a Riobi 500K press fitted with a Dahlgren integrated dampener. Additionally, the ink was printed commercially on a Hamilton Web Press running at 600–800 feet per minute.

| Example 23: | Alkyd 74-7451 (Cargill) | 18.37% |
|---|---|---|
| | Castor Oil (United Catalyst) | 36.46% |
| | Oleic Acid (Henkel Emersol 213) | 11.91% |
| | Phenolic Modified Rosin (Unirez 9405, Union Camp) | 6.8% |
| | Fumaric-modified Rosin (Unirez 8200, Union Camp) | 3.3% |
| | Carbon Black (Regal 400R, Cabot Co.) | 18.9% |
| | Alkali Blue (BASF 515958) | 2.1% |
| | Optilith #3 (Lawter International) | 2.0% |

Example 24 demonstrates the applicability of the present invention to newspaper ink. In one print test, the ink was printed with an A.B. Dick offset duplicator fitted with a Dahlgren dampener. The ink was printed on 30# newspaper stock. The plates were Kodak metal plates and the fountain solution was comprised of ¾ oz. of Rosos KSP #10AS M-2, ½ oz. Kelstar alcohol substitute and the remainder of the 1 quart solution being tap water. The pH was 4.7–5.1. The ink film thickness was 0.7 mil. At least 100 sheets were printed. After blacking out at start, the plate cleaned up as fountain solution was increased. Print quality was slightly light, but acceptable and did print lithographically. Blanket wash up was acceptable using pH 13 water wash on the second wipe. Roller wash up was good at about three minutes.

| Example 24: | Rosin (Sylvaros) | 14.3% |
|---|---|---|
| | Water Reducible Resin (Cargill 074-7451) | 10.0% |
| | Soybean Oil | 18.6% |
| | Oleic Acid | 30.4% |
| | Clay Filler (Kaophile-2, Dry Branch Kaolin Co.) | 8.9% |

| -continued | |
|---|---|
| Carbon Black (Cabot EP115) | 17.9% |

Example 25: Example 25 demonstrates the applicability of the ink composition of Example 1 to a printing process other than lithography. The ink of Example 1 was put on a Miehle Vertical Letterpress printing press. The type used was lead produced on an Intertype casting machine. Five hundred sheets were produced on Nekoosa 24# Ardor bond white paper. At the conclusion of printing, the type and press rollers were cleaned using tap water adjusted to a pH of 13. Print and clean up was of acceptable quality.

Examples 26–32 demonstrate the utility of the present invention with a wide variety of standard acidic fountain solutions and fountain additions. A standard test was conducted utilizing the ink composition of Example 1 on an A.B. Dick 375 offset press. The press was run for 1,000 impressions. The results exhibited acceptable print quality in all cases. The apparatus was acceptably cleaned up using water adjusted to a pH of 13.

| Ex. | Plate | Fountain Solution | Additives | pH |
|---|---|---|---|---|
| 26 | Aluminum | Rosos KSP #10AS M-2 | — | 5.2 |
| 27 | Aluminum | Rosos KSP #10AS M-2 | Kelstar HT100 | 5.2 |
| 28 | Electrostatic | A.B. Dick 4-1080 | — | 4.9 |
| 29 | Electrostatic | A.B. Dick 4-1080 | Kelstar HT100 | 4.9 |
| 30 | Silver Master | 3M Onyx | Kelstar HT100 | 6.0 |
| 31 | Silver Master | Mitsuibisi SLM-OD | Kelstar HT100 | 6.1 |
| 32 | Silver Master | Mitsuibisi SLM-OD | Isopropyl Alcohol (10%) | 6.2 |

Examples 33–35 demonstrate the use of various alkaline wash solutions. A standard test was conducted using the ink composition of Example 1. In all tests, an A.B. Dick 375 offset press was inked and printed. At 100 impression intervals, the press was stopped and the blanket cleaned until a total of 500 sheets were printed. At that point, the press roller train was cleaned using the same solution. The print quality and the clean up were acceptable in all cases.

| Example 33: | Blanket/roller wash | |
|---|---|---|
| | Water | 99% |
| | Sodium Hydroxide to pH of 13 | <1% |

| Example 34: | Blanket/roller wash | |
|---|---|---|
| | Water | 91% |
| | Nonionic surfactant (Mazawet 77 - Mazer Chemical) | 8% |
| | Sodium metasilicate to pH of 12 | <1% |

| Example 35: | Blanket/roller wash | |
|---|---|---|
| | Water | 93% |
| | Butyl Cellosolv | 2% |
| | Nonionic surfactant (Mazawet 77 - Mazer Chemical) | 4% |
| | Sodium metasilicate to pH of 11.7 | <1% |

Example 36 demonstrates a resin system in which no hard resin is present and in which the resin component is comprised solely of water reducible resin components, namely, a short oil alkyd and a modified linseed oil. An ink of the following composition was produced using the standard procedure set forth in Examples 1–4. Press tests were conducted on an A.B. Dick 375 offset duplicator. The fountain solution used was Rosos KSP #10AS M-2 (¾ ounce), Kelstar HT-100 alcohol substitute (¾ ounce), deionized water (3 ounces). Five hundred sheets were printed with excellent print quality. The press blanket and rollers were then cleaned using water adjusted to pH13 using sodium hydroxide.

| Example 36: | Short Oil Alkyd (Cargill 74-7451) AN 47-53 | 16.5% |
|---|---|---|
| | Castor Oil (United Catalyst) | 29.5% |
| | Oleic Acid (Emersol 213 NF, Henkel Co.) | 5.0% |
| | Modified Linseed Oil (Cargill 73-7319) | 30.0% |
| | Carbon Black (Regal 400R - Cabot) | 19.0% |

Example 37 demonstrates letterpress (nonlithographic) printing using a single resin ink composition formulated with a water reducible resin having an Acid Number of approximately 200. Specifically, the water reducible resin was a fumaric acid resin known as Unirez 8200 from Union Camp Co. The ink composition was printed on a dry offset tower of a Taiyo Model #TCH-51620-3P (Tokyo, Japan) equipped with rubber rollers and photopolymer plates. The press was operated at 200 feet per minute. The print quality was acceptable. The tower and plate were cleaned with aqueous alkaline wash solution.

| Example 37: | Varnish cook Temperature: 200° F. (93° C.) | |
|---|---|---|
| | Fumaric Acid Resin (Unirez 8200-Union Camp Co.) | 38.4% |
| | Oleic Acid (Emersol 213 NF, Henkel Co.) | 41.6% |
| | Carbon Black (Cabot Regal 400R) | 20% |

Example 38 demonstrates the use of a water reducible resin (modified oil) as the only component in the varnish of a lithographic ink. The ink was produced by milling the pigment into the alkyd. The ink was evaluated using the procedure set forth in Examples 1–4. The ink of this example was printed with a fountain solution as described in Examples 1–4 having a pH of 6.72 and washed up using the wash solution of Examples 1–4. The water reducible resin of this example was a modified linseed oil containing no additional components. Fifty sheets were printed. Although the print quality and clean up were acceptable, press performance and latitude were less than some of the other examples.

| Example 38: | Modified linseed oil (Cargill 73-7319) AN 95-105 | 78% |
|---|---|---|
| | Carbon Black (Cabot Regal 400R) | 22% |

Example 39 represents a a magnetic ink composition printed via a rotary numbering system. The ink was evaluated by printing MICR codelines on MICR bond paper. Codelines were printed using rotary numbering machines (letterpress) at 8200 impressions per hour. Signal level was 110–120 and good print quality was obtained. The press was cleaned up acceptably using water adjusted to pH 13 using sodium hydroxide.

| Example 39: | Magnetic Iron Oxide (Harcros MO-8029) | 66% |
|---|---|---|
| | Carbon Black (Cabot Regal 400R) | 5% |
| | Alkyd Resin (Cargill 074-7451) | 7% |
| | Phenolic Modified Rosin (Unirez 9405, Union Camp) | 2% |
| | Fumaric Acid Modified Rosin (Unirez 8200, Union Camp) | 1% |
| | Oleic Acid (Emersol 213 NF, Henkel Co.) | 7% |
| | Castor Oil (United Catalyst) | 7% |
| | Solsperse 17000 (ICI/ZENECA) | 4% |
| | Solsperse 5000 (ICI/ZENECA) | 1% |

Examples 40–43 evaluate the use of various surfactants as a part of the following ink composition having a short oil alkyd present in an amount of about 22% by weight of the varnish (the ink composition less the pigment). Such ink composition is within the most preferred range for the particular alkyd. An A.B. Dick 375 offset duplicator was inked to an ink film of 1.7 mil (0.0017 inch). Acceptable print quality was obtained. For each example, one hundred sheets were printed and the blanket was washed using water adjusted to pH 13 using sodium hydroxide. The blanket washing step was evaluated qualitatively. The press was then fitted with a wash up blade and the ink was flushed from the rollers using water adjusted to pH 13 with sodium hydroxide. This operation was timed with a stopwatch. It should be noted that 1.7 mil of ink is excessive but was used to exaggerate the roller washing step.

| Examples 40–43: | Rosin (Sylvaros R, Arizona Chemical) | 2.7% |
|---|---|---|
| | Alkyd (Cargill 74-7451) AN 47-53 | 18.0% |
| | Linseed Oil (Degen Oil) | 18.0% |
| | Oleic Acid (Emersol 213 NF, Henkel Inc.) | 16.0% |
| | Carbon Black (Regal 400R, Cabot Inc.) | 19.0% |
| | Surfactant (see table below) | 2.0% |

| Example | Surfactant | Blanket Wash | Roller Wash |
|---|---|---|---|
| 40 | [none] | Good | 3:52 |
| 41 | Mazawet 77 | Good | 3:08 |
| 42 | Mazeen C-5 | Good | 3:07 |
| 43 | Emphos PS-400 | Good | 3:44 |

Print quality in all of Examples 40–43 was acceptable. Print quality was evaluated with respect to print density, absence (or presence) of ink in nonimage areas, cleanliness and edge definition. The above Roller Wash clean up times showed an improvement of as much as about 20% when surfactant is part of the composition.

Examples 44–50 demonstrate the ability to reduce the water reducible resin component while still maintaining acceptable print quality and press wash-up performance. The procedure was identical to that of Examples 40–43 except that the ink thickness was maintained at 0.7 mil.

| Examples 44–50: | Rosin (Sylvaros R, Arizona Chemical) | 38.4% |
|---|---|---|
| | Alkyd (Cargill, 74-7451) AN 47-53 | 4.0% |
| | Castor Oil (USP, United Catalyst) | 17.6% |
| | Oleic Acid (Emersol 213 NF, Henkel Inc.) | 16.% |
| | Carbon Black (Regal 400R, Cabot Inc.) | 20.0% |
| | Surfactant (See table below) | 5.0% |

| Example | Surfactant | Surf. Conc. | Roller Wash |
|---|---|---|---|
| 44 | [None] | — | 5:50 |
| 45 | Surfonyl 104 | 5% | 5:30 |
| 46 | Emphos PS-400 | 5% | 4:51 |
| 47 | Mazawet 77 | 5% | 4:17 |
| 48 | Macol NP4 | 5% | 2:50 |
| 49 | MQuat 1033 | 5% | 4:30 |
| 50 | Mazeen C-5 | 5% | 4:10 |

In Examples 44–50 the Blanket Wash clean up and the print quality was acceptable for all compositions. Roller Wash clean up time showed an improvement of about 20%–50%.

For Example 51, the procedure of Examples 40–43 was followed with respect to the following ink composition except that the ink thickness was 0.7 mil.

| Example 51: | | |
|---|---|---|
| Rosin (Sylvaros R, Arizona Chemical) | | 34.4% |
| Alkyd (Cargin 74–7451) AN 47–53 | | 4.0% |
| Macol NP4 (PPG Industries) | | 16.0% |
| Castor Oil (USP, United Catalyst) | | 14.4% |
| Oleic Acid (Emersol 213 NF, Henkel Inc.) | | 11.2% |
| Carbon Black (Regal 400R, Cabot Inc.) | | 20.0% |

Both the blanket wash and the print quality were good. The roller clean up time was 4:20 minutes.

For Example 52, the procedure of Examples 40–43 was followed with respect to the following ink composition except that the ink thickness was 0.7 mil.

| Example 52: | | |
|---|---|---|
| Rosin (Sylvaros R, Arizona Chemical) | | 38.4% |
| Alkyd (Cargill 74–7451) AN 47–53 | | 2.4% |
| Macol NP4 (PPG Industries) | | 2.4% |
| Castor Oil (USP, United Catalyst) | | 18.4% |
| Oleic Acid (Emersol 213 NF, Henkel Inc.) | | 18.4% |
| Carbon Black (Regal 400R, Cabot Inc.) | | 20.0% |

The ink film thickness was 0.7 mil. Both the blanket wash and the print quality were good. The roller clean up time was 3:01 minutes.

Examples 53–73 are examples reflecting applicability of the present invention to radiation curable ink compositions. In each of Examples 53–56 and in various other Examples, where indicated, an AB Dick 375 offset press was inked up and the ink film was measured using a Gardner Ink Film Thickness Gauge. The press was fitted with a conventional Dahlgren dampening system. The ink was printed on standard chrome coat 80# paper. Once printed, the stock was passed under a UVEXS LCU 7500 laboratory UV curing system. Print densities, when measured, were evaluated using an X-Rite 418 densitometer.

The press was run for 300 impressions and stopped every 100 impressions, at which time the blanket was cleaned using water adjusted to pH 13 using sodium hydroxide. At the conclusion of the press test, the rollers were cleaned using water adjusted to pH 13 using sodium hydroxide. Print quality and clean-up for each of Examples 53–56 were acceptable. Examples 53–56 were developed to demonstrate the applicability of ink compositions to process colors in accordance with the present invention. The water reducible resin for Examples 53–56 was Cargill's Modified Linseed Oil 73-7319 with an Acid Number of 95-105.

| Example 53: | |
|---|---|
| Ebecure 657 (Radcure Industries) | 45% |
| Modified Linseed Oil 73-7319 (Cargill, Inc.) AN95-105 | 20% |
| Monomer OTA-480 (Radcure Industries) | 15% |
| Igracure 651 (Ciba-Geigy) | 2.5% |
| Igracure 184 (Ciba-Geigy) | 2.5% |
| Regal 400R (Cabot, Inc.) | 15% |
| Ink Film: .5 mil Print Density: 1.6 | |

| Example 54: Process Cyan | |
|---|---|
| Ebecure 657 (Radcure Industries) | 45% |
| Modified Linseed Oil 73-7319 (Cargill, Inc.) | 20% |
| Monomer OTA-480 (Radcure) | 15% |
| Igracure 651 (Ciba-Geigy) | 2.5% |
| Igracure 184 (Ciba-Geigy) | 2.5% |
| Pigment FG 7030 (Toyo Ink) | 15% |
| Ink Film: .4 mil Print Density: 1.40 | |

| Example 55: Process Magenta | |
|---|---|
| Ebecure 657 (Radcure Industries) | 45% |
| Modified Linseed Oil 73-7319 (Cargill, Inc.) | 20% |
| Monomer OTA-480 (Radcure) | 15% |
| Igracure 651 (Ciba-Geigy) | 2.5% |
| Igracure 184 (Ciba-Geigy) | 2.5% |
| Pigment RD 2001 (Uhlich Color) | 15% |
| Ink Film: .4 mil Print Density: 1.31 | |

| Example 56: Process Yellow | |
|---|---|
| Ebecure 657 (Radcure Industries) | 45% |
| Modified Linseed Oil 73-7319 (Cargill, Inc.) | 20% |
| Monomer OTA-480 (Radcure Industries) | 15% |
| Igracure 651 (Ciba-Geigy) | 2.5% |
| Igracure 184 (Ciba-Geigy) | 2.5% |
| Pigment YE 0150 (Uhlich Color) | 15% |
| Ink Film: .45 mil Print Density: 1.09 | |

Examples 57–59 demonstrate the applicability of ink compositions in accordance with the present invention to a variety of monomers. The standard procedure was used from Examples 53–56. Acceptable print quality and clean up were exhibited for each example.

| Example 57: | |
|---|---|
| Ebecryl 657 (Radcure Industries) | 45% |
| Modified Linseed Oil 73-7319 (Cargill, Inc.) | 20% |
| TMPTA (Radcure Industries) | 15% |
| Igracure 651 (Ciba-Geigy) | 2.5% |
| Igracure 184 (Ciba-Geigy) | 2.5% |
| Regal 400R (Cabot, Inc.) | 15% |

| Example 58: | |
|---|---|
| Ebecryl 657 (Radcure Industries) | 45% |
| Modified Linseed Oil 73-7319 (Cargill, Inc.) | 20% |
| Lauryl Methacrylate (Sartomer) | 15% |
| Igracure 651 (Ciba-Geigy) | 2.5% |
| Igracure 184 (Ciba-Geigy) | 2.5% |
| Regal 400R (Cabot, Inc.) | 15% |

| Example 59: | |
|---|---|
| Ebecryl 657 (Radcure Industries) | 45% |
| Modified Linseed Oil 73-7319 (Cargill, Inc.) | 20% |
| Isooctyl Acrylate (Sartomer) | 15% |
| Igracure 651 (Ciba-Geigy) | 2.5% |
| Igracure 184 (Ciba-Geigy) | 2.5% |
| Regal 400R (Cabot, Inc.) | 15% |

Examples 60–61 demonstrate the applicability of ink compositions in accordance with the present invention to a variety of oligomers. The standard procedure of Examples 53–56 was followed. Acceptable print quality and clean up were exhibited for each Example.

| Example 60: Urethane Oligomer | |
|---|---|
| Resin 15-1514 (Cargill, Inc.) | 45% |
| Modified Linseed Oil 73-7319 (Cargill, Inc.) | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

| Example 61: Epoxy Oligomer | |
|---|---|
| Ebecryl 1608 (Radcure Industries) | 45% |
| Modified Linseed Oil 73-7319 (Cargill, Inc.) | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

Examples 62–65 demonstrate the applicability of ink compositions in accordance with the present invention to a variety of water reducible resins suitable for use in the present invention. The standard procedure of Examples 53–56 was followed. Acceptable print quality and clean up were exhibited for each of Examples 62–65.

| Example 62: Short Oil Alkyd | |
|---|---|
| Ebecryl 657 (Radcure Industries) | 45% |
| Alkyd 74-7451 (Cargill, Inc.) AN 47-53 | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

| Example 63: Modified Polyolefin | |
|---|---|
| Ebecryl 657 (Radcure Industries) | 45% |
| Polyolefin 73-7358 (Cargill, Inc.) AN 25-30 | 20% |
| OTA-480 (Radcure Industries) | 15% |
| Igracure 651 (Ciba-Geigy) | 2.5% |
| Igracure 184 (Ciba-Geigy) | 2.5% |
| Carbon Black-Regal 400R (Cabot, Inc.) | 15% |

| Example 64: Short Oil Alkyd | |
|---|---|
| Ebecryl 657 Oligomer (Radcure Industies) | 50.0% |
| Alkyd 74-7451 (Cargill, Inc.) AN 47-53 | 13% |
| OTA-480 Monomer (Radcure Industries) | 12% |
| Igracure 651 (Ciba Geigy) | 2.5% |
| Igracure 184 (Ciba Geigy) | 2.5% |
| Carbon Black-Regal 400R (Cabot Inc.) | 20% |

| Example 65: Short Oil Alkyd | |
|---|---|
| Ebecryl 657 Oligomer (Radcure Industries) | 40% |
| Alkyd 74-7416 (Cargill, Inc.) AN 53-58 | 20% |
| TMPTA Monomer (Radcure Industries) | 15% |
| Durocure 1173 (Ciba Geigy) | 2.5% |
| Igracure 184 (Ciba Geigy) | 2.5% |
| Carbon Black-Regal 400R (Cabot Inc.) | 20% |

Examples 66–69 demonstrate the use of various initiators for use with ink compositions containing a water reducible resin. Additionally, the following examples demonstrate the applicability to UV cured gloss overprint varnishes. The varnishes were tested by blade coating samples using a doctor blade, which were then cured through the lab UV unit. Acceptable print quality and clean up were exhibited for each of Examples 66–69. Further, hard, glossy films were obtained in all cases. No inhibition of cure rate was observed when compared to identical systems without the water reducible resin.

| Example 66: Ebecryl 657 (Radcure Industries) | 60% |
|---|---|
| OTA-480 (Radcure Industries) | 15% |
| Igracure 369 (Ciba-Geigy) | 5% |
| Modified Linseed Oil 73-7319 (Cargill, Inc.) | 20% |

| Example 67: Ebecryl 657 (Radcure Industries) | 60% |
|---|---|
| OTA-480 (Radcure Industries) | 15% |
| Igracure 651 (Ciba-Geigy) | 5% |
| Modified Linseed Oil 73-7319 (Cargill, Inc.) | 20% |

| Exhibit 68: Ebecryl 657 (Radcure Industries) | 60% |
|---|---|
| OTA-480 (Radcure Industries) | 15% |
| Darocur 1173 (Ciba-Geigy) | 5% |
| Modified Linseed Oil 73-7319 (Cargill, Inc.) | 20% |

| Example 69: Ebecryl 657 (Radcure Industries) | 60% |
|---|---|
| OTA-480 (Radcure Industries) | 15% |
| Igracure 184 (Ciba-Geigy) | 5% |
| Modified Linseed Oil 73-7319 (Cargill, Inc.) | 20% |

The test of Example 70 was conducted using the process color inks of Examples 53–56 which were printed using UV rotary letterpress equipment. The press was a Gallus R-250 rotary letterpress set up to print labels. The stock used was 60# Krome Kote label stock from Green Bay Packaging. The cure system was a UVT 58087 lamp system produced by UVT incorporated. The lamp system was set at 350 watts per inch at 14 amps and 450 volt supply. The press was run at 18 meters per minute and good print quality and densities were obtained for all inks. Upon completion of printing, the plate and inking rollers were cleaned using a wash solution comprised of sodium metasilicate, sodium hydroxide and Mazawet 77 (2%) at a pH of 12.8. The clean-up was of the same quality as compared to conventional ink and solvent based blanket and roller wash.

Example 71 demonstrates the applicability of the present invention to a lithographic label manufacturing process. The press was a Ryobi model 3202 MCS using a conventional integrated dampener and Onyx plate material (3M Company). The fountain solution was Onyx concentrate from 3M Company (6 ounces), Starfount HT-100 from Kelstar Enterprises (6 ounces) and deionized water (116 ounces). The UV curing system was Prime UV model 120/34 manufactured by Prime Systems Inc. The unit was set at power level 4. The test consisted of printing Arabesque label stock at a press speed of 6000 impressions per hour. Immediately after printing, the labels were cured at press speeds, slit and rewound in roll form. Acceptable print densities were obtained at an ink film of 0.4 mil. After curing, no offset was evident when finishing labels were unrolled and examined visually. Good print quality was obtained and acceptable blanket and roller washups were obtained using water adjusted to pH 13 using caustic soda.

| Example 71: Ebecryl 657 (Radcure) | 45.0% |
|---|---|
| OTA-480 (Radcure) | 15.0% |
| Modified Linseed Oil 73-7319 (Cargill) | 20.0% |
| Daracure 1130 (Ciba-Geigy) | 2.5% |
| Igracure 369 (Ciba-Geigy) | 2.5% |
| Carbon Black-Regal 400R (Cabot) | 15.0% |

Examples 72–73 demonstrate a radiation curable ink with higher and lower levels of the water reducible resin. The procedure of Example 35 was followed. Acceptable print quality and clean up were exhibited for each example.

| Example 72: Low Level | |
|---|---|
| Ebecryl 657 (Radcure Industries) | 45% |
| Modified Linseed Oil 73-7319 (Cargill, Inc.) | 5% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

| Example 73: High Level | |
|---|---|
| Ebecryl 657 (Radcure Industries) | 45% |
| Modified Linseed Oil 73-7319 (Cargill, Inc.) | 40% |
| OTA-480 (Radcure Industries) | 15% |
| Igracure 184 (Ciba-Geigy) | 2.5% |
| Igracure 651 (Ciba-Geigy) | 2.5% |
| Carbon Black-Regal 400R (Cabot, Inc.) | 15% |

Examples 74–78 demonstrate ink compositions of the present invention used in flexographic printing. One kilogram of finished ink was produced in all examples. The inks were produced in two separate steps and then combined to produce press ready ink. The first step involved manufacture of a pigment base or dispersion. In all examples the oil, water reducible resin and pigment were combined, mixed, and milled on a three roll mill to produce a concentrated pigment base. The second step involved production of a diluent varnish to reduce viscosity of the ink. This step involved dissolving a hard resin into the solvent to produce a varnish. This solution was produced by warming the solvent to 200° F. (93° C.) until all resin was dissolved and then cooling to room temperature. The pigment base and varnish were combined and mixed to produce press-ready ink. In some cases additional solvent was added to provide desired viscosity. A Mark-Andy model 830 label press was used to evaluate all inks. The press was fitted with a 200 line, pyramid cell, seven volume, 30 micron anilox roll. The plates were photo polymer Cyrel plates. The stock printed was 5¾" white litho roll pressure sensitive label stock purchased from Label Products (Mpls, Minn.). A total of 1,000 impressions were run in all examples. The rollers, anilox roll, ink reservoir and plate were then cleaned using water adjusted to pH 13 with sodium hydroxide. All examples provided acceptable print quality and clean up.

| Example 74: Non Break Linseed Oil (Reichhold Chem) | 9% |
|---|---|
| Water Reducible Resin 74-7416 (Cargill Inc.) | 13% |
| Fumaric Modified Rosin (Unirez 8200 Union Camp) | 26% |
| Cyan Pigment Lionel Blue FG-7330 (Toyo Ink) | 7% |
| n-Butanol (Ashland Chemical) | 45% |

Resin 74-7416 is a long oil alkyd supplied as a solution containing 20% propylene glycol t-butyl ether. The resin in this example was used in this form.

| Example 75: Non Break Linseed Oil (Reichhold Chem) | 9% |
|---|---|
| Water Reducible Resin Chempol #0453 (Cook Composites) | 13% |
| Fumaric Modified Rosin (Unirez 8200 Union Camp) | 26% |
| Cyan Pigment Lionel Blue FG-7330 (Toyo Ink) | 7% |
| Glycol ether PM acetate (Ashland Chem) | 45% |

Chempol 0453 is a styrenated epoxy supplied as a solution containing 30% Butoxyethanol. The resin in this example was used in this form.

| Example 76: Non Break Linseed Oil (Reichhold Chem) | 9% |
|---|---|
| Water Reducible Resin 72-7203 (Cargill Inc.) | 13% |
| Fumaric Modified Rosin (Unirez 8200 Union Camp) | 26% |
| Cyan Pigment Lionel Blue FG-7330 (Toyo Ink) | 7% |
| n-Butanol (Ashland Chemical) | 45% |

Cargill 72-7203 is a water reducible polyester which is supplied as a solution containing 18.4% sec-butanol and 6.6% ethylene glycol monobutyl ether. The resin in this example was used in this form.

| Example 77: Non Break Linseed Oil (Reichhold Chem) | 9% |
|---|---|
| Water Reducible Resin 73-7358 (Cargill) | 13% |
| Fumaric Modified Rosin (Unirez 8200 Union Camp) | 26% |
| Cyan Pigment Lionel Blue FG-7330 (Toyo Ink) | 7% |
| Glycol ether PM acetate (Ashland Chemical) | 45% |

Cargill 73-7358 is a water reducible modified polyolefin supplied as 100% resin. The resin in this example was used in this form.

In Example 78, liquid inks were produced by cooking all components except colorants at 300° F. (149° C.) for one hour. This produced a clear, low viscosity varnish which was then cooled to room temperature. To this solution, the colorant was added, with agitation, until all dye dissolved in the ink. The ink was tested on a GP Tinter set up to run full sheet tinting on a Didde Glasser Web press. The paper was Arbor Bond 24# white paper (Simpson Paper) and the press was run at 200 feet/minute. Pink paper was produced which had even color tint and good drying characteristics.

| Example 78: Non Break Linseed Oil (Reichhold Chem) | 60% |
|---|---|
| Oleic Acid Emersol 213 NF (Henkel) | 18% |
| DOCCO #008 | 13% |
| Water Reducible Resin 74-7416 (Cargill) | 3% |
| Neptune Orange #206 Dye (BASF) | 2% |
| Neptune Red #486 Dye (BASF) | 4% |

Examples 79–82 demonstrate sheet fed ink compositions of the present invention which set quickly and have exceptionally long life on the press. These inks were tested in a commercial four process color sheet fed printing operation in which they were substituted for conventional four process color inks manufactured by United States Printing Inks (USPI inks). The inks were printed on a 40 inch Roland 600; 6 color with tower coater; RCI, CCI press fitted with a Rolandmatic dampening unit. Dayco 8500, 3-ply compressible blankets, measuring 34"×41"×0.067" were used. The plates were 3M GMX plates. The stock was an 80 lb. matte frostbite. The fountain solution was prepared by adding 4.5 ounches of Emerald Premium DCQ, 2002 (Anchor) to 1 gallon of water, resulting in a pH of 3.9. Print quality, as measured by dot gain, gloss, set, water window, and rub, of the inks of Examples 79–82 was equal to or better than the conventional USPI inks. The inks were washed from the blankets and rollers using water adjusted to pH 13 using sodium hydroxide. The life tests were performed by placing a thin film of each type of ink on a nonporous glass surface. At 1 hour intervals, a strip of 80 lb. matte frostbite stock was placed over the ink film and a 400 gram weight was applied to the stock. The weight was then removed and the stock examined for ink transfer. The life of the ink was determined to be the time after which no ink transfer was observed. The life on press of the inks of Examples 79–82 was 31 hours and was considerably greater than the life on press of the commercial USPI inks which was 5 hours. The life of the Example 79–82 inks was also considerably greater than conventional sheet fed process color inks of Toyo Mark V ESLZ which had a life of 8 hours. Print quality and clean up were acceptable.

Example 79: Process Black

| | |
|---|---|
| Alkyd 74-7451 (Cargill) | 17.16% |
| Modified Linseed Oil (Cargill 73-7319) | 3.58% |
| Castor Oil (United Catalyst) | 10.72% |
| Oleic Acid (Henkel Emersol 213) | 24.24% |
| Phenolic Modified Rosin (Unirez 9405, Union Camp) | 6.72% |
| Fumaric Modified Rosin (Unirez 8100, Union Camp) | 4.50% |
| Fumaric Modified Rosin (Unirez 8200, Union Camp) | 4.50% |
| Linseed Oil (Degen Oil OGN104-14) | 3.58% |
| Wax (C-348, Lawter International) | 5.0% |
| Cobalt-Manganese Lin All Drier (OMG) | 2.0% |
| Carbon Black (Cabot Regal 400R) | 18.0% |

Example 80: Process Cyan

| | |
|---|---|
| Alkyd 74-7451 (Cargill) | 18.0% |
| Castor Oil (United Catalyst) | 21.75% |
| Oleic Acid (Henkel Emersol 213) | 18.0% |
| Phenolic Modified Rosin (Unirez 9405, Union Camp) | 7.05% |
| Fumaric Modified Rosin (Unirez 8100, Union Camp) | 4.72% |
| Fumaric Modified Rosin (Unirez 8200, Union Camp) | 3.75% |
| Linseed Oil (Degen Oil OGN104-14) | 3.00% |
| Wax (C-348, Lawter International) | 2.00% |
| Cobalt-Manganese Lin All Drier (OMG) | 4.72% |
| Toyo Lionel Blue 7330 | 17.0% |
| Flint CDR 15DT 637 | 17.0% |

Example 81: Process Magenta

| | |
|---|---|
| Alkyd 74-7451 (Cargill) | 18.0% |
| Castor Oil (United Catalyst) | 21.75% |
| Oleic Acid (Henkel Emersol 213) | 17.0% |
| Phenolic Modified Rosin (Unirez 9405, Union Camp) | 7.05% |
| Fumaric Modified Rosin (Unirez 8100, Union Camp) | 4.72% |
| Fumaric Modified Rosin (Unirez 8200, Union Camp) | 4.72% |
| Linseed Oil (Degen Oil OGN104-14) | 3.75% |
| Wax (C-348, Lawter International) | 5.0% |
| Cobalt-Manganese Lin All Drier (OMG) | 2.0% |
| Toyo Magenta 6B-NS | 16.0% |
| Uhlich Lithol Rubine | 16.0% |

Example 82: Process Yellow

| | |
|---|---|
| Alkyd 74-7451 (Cargill) | 18.24% |
| Castor Oil (United Catalyst) | 22.04% |
| Oleic Acid (Henkel Emersol 213) | 19.2% |
| Phenolic Modified Rosin (Unirez 9405, Union Camp) | 7.14% |
| Fumaric Modified Rosin (Unirez 8100, Union Camp) | 4.79% |
| Fumaric Modified Rosin (Unirez 8200, Union Camp) | 4.79% |
| Linseed Oil (Degen Oil OGN104-14) | 3.80% |
| Wax (C-348, Lawter International) | 3.0% |
| Cobalt-Manganese Lin All Drier (OMG) | 2.0% |
| Toyo Yellow 1405-G | 15.0% |
| Sun Sunbrite Yellow 12 273-0046 | 15.0% |

Example 83 illustrates how a fatty acid, such as oleic acid, can be used to reduce the volatile hydrocarbon content of a heatset ink without compromising set or drying properties. The three formulations (Inks A, B and C) identified below have a resin/solvent ratio sufficient to provide a viscosity of 200 poise and were formulated according to the formula:

78% Varnish (resins+solvent)
18% Carbon black (Regal 400 R Cabot)
4% Tetron 70 wax (Lawter International)

Ink A, which does not contain oleic acid, required 20.3% volatile solvent. Inks B and C, which contain 3.9% and 7.8% oleic acid, respectively, required 15.6% and 13.3% volatile solvent, respectively.

Example 83:

Ink A

| | |
|---|---|
| Long Oil Alkyd (Cargill 74-7416, AN = 56.6) | 16.1% |
| Rosin (Sylvaros, AN = 170) | 34.5% |
| Phenolic Modified Rosin (Unirez 9405, Union Camp) | 7.1% |
| Magie 47 | 20.3% |
| Tetron 70 Wax (Lawter International) | 4.0% |
| Carbon Black (Regal 400R, Cabot) | 18.0% |

Ink B

| | |
|---|---|
| Long Oil Alkyd (Cargill 74-7416, AN = 56.6) | 16.4% |
| Rosin (Sylvaros, AN = 170) | 34.9% |
| Phenolic Modified Rosin (Unirez 9405, Union Camp) | 7.2% |
| Oleic Acid (Henkel Emersol 213) | 3.9% |
| Magie 47 | 15.6% |
| Tetron 70 Wax (Lawter International) | 4.0% |
| Carbon Black (Regal 400R, Cabot) | 18.0% |

Ink C

| | |
|---|---|
| Long Oil Alkyd (Cargill 74-7416, AN = 56.6) | 15.9% |
| Rosin (Sylvaros, AN = 170) | 34.0% |
| Phenolic Modified Rosin (Unirez 9405, Union Camp) | 7.0% |
| Oleic Acid (Henkel Emersol 213) | 7.8% |
| Magie 47 | 13.3% |
| Tetron 70 Wax (Lawter International) | 4.0% |
| Carbon Black (Regal 400R, Cabot) | 18.0% |

The inks of Example 83 were tested on a 14 inch Ryobi 3302, 2 tower press fitted with a Crestline dampening unit. David M, 5-ply blankets measuring 13"×19.5"×098" were used. Plates were Polychrome. The fountain solution was prepared by adding 3 ounces Rosos KSP #10AS M-2 to a gallon of water, resulting in a pH of 5.8. The inks were printed on 80 lb. Krome Coated stock. Print quality was good and drying was simulated by passing the printed stock twice, a distance of 3 inches under a heatgun (Master Model 1000A). In all cases, the ink films were satisfactorily dried. The inks were washed from the blankets using water adjusted to a pH of 13 using sodium hydroxide.

Examples 84–86 illustrate the use of other hard resins, in combination with a water reducible resin and rosin, in the formulation of inks of viscosity 200 poise. These inks were made by combining 78% of a varnish containing the hard resin, rosin, and water reducible resin, 18% pigment and 4% wax. The inks were printed and dried according to the procedure set forth in the previous example. Print quality was good and the drying was acceptable. The inks were removed from the blankets and rollers with water adjusted to a pH of 13 with sodium hydroxide.

Example 84:

| | |
|---|---|
| Long Oil Alkyd (Cargill 74-7416, AN = 56.6) | 16.3% |
| Rosin (Sylvaros, AN = 170) | 34.9% |
| Phenolic Modified Rosin (Unirez 9175, Union Camp) | 7.2% |
| Magie 47 | 19.5% |
| Tetron 70 Wax (Lawter International) | 4.0% |
| Carbon Black (Regal 400R, Cabot) | 18.0% |

Example 85:

| | |
|---|---|
| Long Oil Alkyd (Cargill 74-7416, AN = 56.6) | 16.9% |
| Rosin (Sylvaros, AN = 170) | 36.3% |
| Maleic Modified Rosin (Unirez 4253, Union Camp) | 7.5% |
| Magie 47 | 16.5% |
| Tetron 70 Wax (Lawter International) | 4.0% |
| Carbon Black (Regal 400R, Cabot) | 18.0% |

Example 86:

| | |
|---|---|
| Long Oil Alkyd (Cargill 74-7416, AN = 56.6) | 16.3% |
| Rosin (Sylvaros, AN = 170) | 34.9% |
| Fumaric Modified Rosin (Unirez 8200, Union Camp) | 7.2% |
| Magie 47 | 19.5% |
| Tetron 70 Wax (Lawter International) | 4.0% |
| Carbon Black (Regal 400R, Cabot) | 18.0% |

For all of the above examples involving printing, print quality evaluations included visual examinations to evaluate the amount, if any, of background ink, the ability of the ink to hold a "reverse" open and the ability of the ink to provide sharp edge definition. All ink formulations in the above examples provided varying degrees of acceptable print quality.

In addition, for Examples 1-4, a standard Sutherland "rub" test was conducted to evaluate the permanency or adhesion of the ink to the substrate. Such tests showed acceptable print quality results. Press or "cut" tests were also conducted with respect to each of the ink formulations of Examples 1-4. These involved stacking a selected number of printed sheets, applying a pressure to such sheets for a selected period of time and then determining the amount, if any, of ink transfer. All results showed acceptable ink transfer results. Sorter evaluation was also conducted with the printed sheets of Examples 1-4. Such tests met acceptable standards for permanancy of the printed image.

The washability of the blanket using a shop towel saturated with the wash solution was evaluated by wiping the blanket with a single pass to check removal of image. The washability of the roller train was evaluated by timing removal of ink from the rollers, etc.

Although the description of the preferred composition and method have been quite specific, it is contemplated that various modifications could be made without deviating from the spirit of the present invention. Accordingly, it is intended that the scope of the present invention be dictated by the appended claims rather than by the description of the preferred composition and methods.

I claim:

1. A varnish for an oil based ink composition comprising a resin component and an oil or diluent component compatible with said resin component, said resin component comprising at least 5% by weight of a water insoluble hard resin and at least 5% by weight of an unneutralized, acid functional, water reducible resin.

2. A varnish for an oil based ink composition comprising a resin component comprised of at least 5% by weight of an unneutralized, acid functional, water reducible resin and an oil or diluent component compatible with said resin component and comprising a fatty acid, the varnish comprising at least 1% by weight said fatty acid.

3. The varnish of claim 2 comprising at least 5% by weight of said fatty acid.

4. The varnish of claim 2 wherein said fatty acid is oleic acid.

5. The varnish of claim 2 being substantially free of volatile petroleum solvent.

6. The varnish of claim 1 wherein said hard resin has an acid number of at least 15.

7. The varnish of claim 6 wherein said hard resin has an acid number of at least 40.

8. The varnish of claim 7 wherein said hard resin has an acid number of at least 80.

9. The varnish of claim 1 wherein said ink composition is a heat set ink composition.

10. The varnish of claim 1 comprising at 1% by weight of a fatty acid.

11. The varnish of claim 10 wherein said fatty acid is oleic acid.

12. The varnish of claim 10 wherein said water reducible resin is an alkyd.

13. The varnish of claim 1 wherein said water reducible resin is an alkyd.

14. The varnish of claim 1 being a varnish for a lithographic ink composition.

15. An ink composition comprising the varnish of claim 1 and a pigment component.

16. The ink composition of claim 15 being a lithographic ink composition.

17. The varnish of claim 2 wherein said fatty acid is one or more of oleic, palmitoleic, steric, linoleic and tall oil acids.

18. The varnish of claim 1 wherein said fatty acid is one or more of oleic, palmitoleic, steric, linoleic and tall oil acids.

* * * * *